(12) United States Patent
Sawamura et al.

(10) Patent No.: US 11,834,603 B2
(45) Date of Patent: Dec. 5, 2023

(54) HEAT DISSIPATION SHEET, HEAT DISSIPATION MEMBER, AND SEMICONDUCTOR DEVICE

(71) Applicant: Mitsubishi Chemical Corporation, Tokyo (JP)

(72) Inventors: Toshiyuki Sawamura, Tokyo (JP); Toshiyuki Tanaka, Tokyo (JP); Akira Watanabe, Tokyo (JP); Katsuhiko Hidaka, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 684 days.

(21) Appl. No.: 17/022,305

(22) Filed: Sep. 16, 2020

(65) Prior Publication Data

US 2020/0407618 A1 Dec. 31, 2020

Related U.S. Application Data

(63) Continuation of application No. PCT/JP2019/013966, filed on Mar. 29, 2019.

(30) Foreign Application Priority Data

Mar. 30, 2018 (JP) ................. 2018-068075
Mar. 30, 2018 (JP) ................. 2018-068471
Mar. 13, 2019 (JP) ................. 2019-046007

(51) Int. Cl.
*C08K 3/38* (2006.01)
*C08K 7/18* (2006.01)
(Continued)

(52) U.S. Cl.
CPC ............. *C09K 5/14* (2013.01); *C08K 3/22* (2013.01); *C08K 3/38* (2013.01); *C08K 7/18* (2013.01);
(Continued)

(58) Field of Classification Search
CPC ... C09K 5/14; C08K 3/22; C08K 3/38; C08K 7/18; C08K 2003/2227; C08K 2003/385;
(Continued)

(56) References Cited

U.S. PATENT DOCUMENTS

2020/0203250 A1* 6/2020 Kuniyasu ................ H01L 23/42
2021/0070952 A1* 3/2021 Suzumura ........... H01L 23/3733
2021/0139761 A1* 5/2021 Kawahara ............... B32B 27/08

FOREIGN PATENT DOCUMENTS

EP 2 786 961 A1 10/2014
EP 3 103 766 A1 12/2016
(Continued)

OTHER PUBLICATIONS

International Search Report dated Jun. 11, 2019 in PCT/JP2019/013966 filed Mar. 29, 2019 (with English translation), 2 pages.
(Continued)

*Primary Examiner* — David Vu
*Assistant Examiner* — Brandon C Fox
(74) *Attorney, Agent, or Firm* — Oblon, McClelland, Maier & Neustadt, L.L.P.

(57) ABSTRACT

A heat dissipation sheet 10 includes cohesive inorganic filler particles 1 having a breaking strength of 20 MPa or lower and a modulus of elasticity of 48 MPa or higher and a matrix resin 2. Half or more of the cohesive inorganic filler particles 1 in the heat dissipation sheet 10 satisfy the following conditions A and B, and the cohesive inorganic filler particles satisfying the following conditions A and B satisfy the following condition C or D
  Condition A: cohesive inorganic filler particles are in surface contact with each other
  Condition B: an aspect ratio is within a range of a number larger than 1 and less than or equal to 2
  Condition C: in triangles formed to have one side which is a straight line constituted by a contact interface
  (Continued)

between cohesive inorganic filler particles and an apex which is a center of a virtual circle of the cohesive inorganic filler, a sum $S_t$ of areas of triangles in which an angle $\theta_1$ formed by connecting both ends of the straight line to the apex becomes 30 degrees or larger is 20% or more with respect to a sum $S_h$ of cross-sectional areas of the cohesive inorganic filler particles Condition D: the sum $S_h$ is 90% or less with respect to a sum $S_v$ of areas of virtual circles of the cohesive inorganic filler particles.

6 Claims, 5 Drawing Sheets

(51) Int. Cl.
  *H01L 23/373* (2006.01)
  *C09K 5/14* (2006.01)
  *C08K 3/22* (2006.01)
  *H01L 23/36* (2006.01)

(52) U.S. Cl.
  CPC .......... *H01L 23/36* (2013.01); *H01L 23/3733* (2013.01); *H01L 23/3737* (2013.01); *C08K 2003/2227* (2013.01); *C08K 2003/385* (2013.01); *C08K 2201/001* (2013.01)

(58) Field of Classification Search
  CPC .......... C08K 2201/001; H01L 23/3737; H01L 23/373; H01L 23/36; H01L 23/3733
  See application file for complete search history.

(56) References Cited

FOREIGN PATENT DOCUMENTS

| JP | 5679083 B2 | 3/2015 |
| JP | 2015-189609 A | 11/2015 |
| JP | 2016-135730 A | 7/2016 |
| JP | 2017-59704 A | 3/2017 |
| WO | WO 2012/070289 A1 | 5/2012 |
| WO | WO 2015/119198 A1 | 8/2015 |

OTHER PUBLICATIONS

Extended European Search Report dated May 18, 2021 in European Patent Application No. 19775479.9, 4 pages.

* cited by examiner

HEAT DISSIPATION SHEET, HEAT DISSIPATION MEMBER, AND SEMICONDUCTOR DEVICE

This application is a continuation application of International Application No. PCT/JP2019/013966, filed on Mar. 29, 2019, which claims the benefit of priority of the Japanese Patent Application No. 2018-068075, filed Mar. 30, 2018, Japanese Patent Application No. 2018-068471, filed Mar. 30, 2018, and Japanese Patent Application No. 2019-046007, filed Mar. 13, 2019, the content of which is incorporated herein by reference.

TECHNICAL FIELD

The present invention relates to a heat dissipation sheet, a heat dissipation member, and a semiconductor device.

BACKGROUND ART

Much research has been conducted regarding heat dissipation sheets having favorable heat conduction properties and excellent insulation properties. Particularly, there is an ongoing attempt to mix filler particles into a resin and thereby obtain a heat dissipation resin sheet satisfying a sufficient standard regarding heat conduction properties and insulation properties. Various kinds of oxide particles and nitride particles are used as filler particles which are contained in such a heat dissipation resin sheet, and much research has also been carried out on particle diameters thereof, a particle size distribution, and the like.

It has been attempted to use hexagonal crystalline boron nitride particles as filler particles which are contained in a heat dissipation sheet. Generally, hexagonal crystalline boron nitride particles are crystals on a thin plate and have high heat conductivity in a surface direction of a thin plate thereof but have low heat conductivity in a thickness direction of a thin plate. In addition, when thin plate-shaped boron nitride particles are formulated into a heat dissipation sheet, they are orientated parallel to a sheet surface during a process of making a sheet, and thus heat conduction properties of the sheet in the thickness direction are never favorable.

Materials for enhancing heat conduction properties of a sheet in the thickness direction include boron nitride cohesive particles.

It is widely known that heat conduction properties of a sheet in the thickness direction can be improved by using boron nitride cohesive particles. First of all, the inventors developed boron nitride cohesive particles having a house-of-cards structure (for example, refer to Patent Literature 1). Moreover, the inventors developed boron nitride cohesive particles having a house-of-cards structure which has a relatively large average particle diameter and seldom collapses even if a pressure is applied thereto (for example, refer to Patent Literature 2). Since heat conduction paths are secured due to the house-of-cards structure, these boron nitride cohesive particles impart excellent heat conduction properties to a heat dissipation sheet in the thickness direction by being contained in the sheet. In addition, although no supplementary binder is used, boron nitride particles cohere with each other in the boron nitride cohesive particles. For this reason, even if an external force is applied during a process of making a sheet, boron nitride cohesive particles do not easily collapse, heat conduction paths are maintained, heat can dissipate in the thickness direction of a sheet, and excellent heat conduction properties can be achieved (for example, refer to Patent Literature 3).

In addition, as a molding method of enhancing heat conduction properties of a sheet in the thickness direction, a method of enhancing heat conductivity by bringing boron nitride cohesive particles inside a sheet into surface contact with each other is known (for example, refer to Patent Literature 4).

CITATION LIST

Patent Literature

[Patent Literature 1] Japanese Patent No. 5679083
[Patent Literature 2] Japanese Unexamined Patent Application, First Publication No. 2016-135730
[Patent Literature 3] PCT International Publication No. WO2015/119198
[Patent Literature 4] PCT International Publication No. WO2012/070289

SUMMARY OF INVENTION

Technical Problem

However, the particles having a house-of-cards structure disclosed in Patent Literature 1 to Patent Literature 3 described above have a problem in that fine voids are likely to remain between the filler particles and it is difficult to ensure sufficient insulation properties.

As disclosed in Patent Literature 4, a high pressure is required to bring cohesive particles into surface contact with each other. In the method disclosed in Patent Literature 4, secondary particles having a high modulus of elasticity, specifically, a modulus of elasticity of 46 MPa or lower are used. Patent Literature 4 discloses that there is a problem in that if the modulus of elasticity of secondary particles exceeds 46 MPa, the secondary particles come into point contact with each other as shown in FIG. 4 of Patent Literature 4 so that sufficient heat conduction properties cannot be obtained.

Here, an object of the present invention is to obtain a heat dissipation sheet, a heat dissipation member, and a semiconductor device having better heat conduction properties and insulation properties than those of heat dissipation sheets which have already been developed.

Solution to Problem

The inventors pursued studies in order to obtain a heat dissipation sheet having better heat conduction properties and insulation properties. As a result of earnest research, the inventors found a heat dissipation sheet including cohesive inorganic filler particles and a resin, that is, a heat dissipation sheet in which in an observation of a cross section of the heat dissipation sheet in a thickness direction, the cohesive inorganic filler particles come into contact with each other, an outer edge portion which is a contact interface between these cohesive inorganic filler particles is deformed and/or breaks at the time of sheet molding, and thereby the cohesive inorganic filler particles come into surface contact with each other and constitute a straight line part. Specifically, when cohesive inorganic filler particles having a relatively high modulus of elasticity and a low breaking strength are used such that an amount of deformation in an appropriate range is achieved, the cohesive inorganic filler particles in the heat dissipation sheet are appropriately deformed or break after they come into contact with each other, and thus the cohesive inorganic filler particles come into surface contact with each other and are less likely to break completely. As a result, the inventors found that thick paths for heat transfer are formed between the cohesive inorganic filler particles and these boron nitride filler particles maintain a cohesive structure so that a heat dissipation sheet having better heat conduction properties and insulation properties can be obtained, and accomplished the present invention.

That is, the present invention has the following aspects.

(1) A heat dissipation sheet is provided, including cohesive inorganic filler particles and a resin, in which a breaking strength of the cohesive inorganic filler particles is 20 MPa or lower, and a modulus of elasticity of the cohesive inorganic filler particles is 48 MPa or higher, and in which half or more of the cohesive inorganic filler particles included in the heat dissipation sheet satisfy the following conditions A and B, and the cohesive inorganic filler particles satisfying the following conditions A and B satisfy the following condition C.

Condition A: cohesive inorganic filler particles are in surface contact with each other Condition B: an aspect ratio expressed by a ratio of a major diameter to a minor diameter (major diameter/minor diameter) is within a range of a number larger than 1 and less than or equal to 2

Condition C: in an observation of a cross section of the heat dissipation sheet in a thickness direction, in triangles formed to have one side which is a straight line constituted by a contact interface between cohesive inorganic filler particles and an apex which is a center of a virtual circle having a largest diameter of the cohesive inorganic filler particle as a diameter, a sum $S_t$ of areas of triangles in which an angle $\theta_1$ formed by connecting both ends of the straight line to the apex becomes 30 degrees or larger is 20% or more with respect to a sum $S_h$ of cross-sectional areas of the cohesive inorganic filler particles (2) A heat dissipation sheet is provided, including cohesive inorganic filler particles and a resin, in which a breaking strength of the cohesive inorganic filler particles is 20 MPa or lower, and a modulus of elasticity of the cohesive inorganic filler particles is 48 MPa or higher, and in which half or more of the cohesive inorganic filler particles included in the heat dissipation sheet satisfy the following conditions A and B, and the cohesive inorganic filler particles satisfying the following conditions A and B satisfy the following condition D.

Condition A: cohesive inorganic filler particles are in surface contact with each other Condition B: an aspect ratio expressed by a ratio of a major diameter to a minor diameter (major diameter/minor diameter) is within a range of a number larger than 1 and less than or equal to 2

Condition D: in an observation of a cross section of the heat dissipation sheet in a thickness direction, a sum $S_h$ of cross-sectional areas of the cohesive inorganic filler particles is 90% or less with respect to a sum $S_v$ of areas of virtual circles having a largest diameter of the cohesive inorganic filler particle as a diameter (3) In the heat dissipation sheet according to (1) or (2), the cohesive inorganic filler particles are boron nitride cohesive particles having a house-of-cards structure.

(4) A heat dissipation member is provided, including a heat dissipation sheet which includes cohesive inorganic filler particles and a resin, and a metal substrate to which the heat dissipation sheet adheres, in which a breaking strength of the cohesive inorganic filler particles is 20 MPa or lower, and a modulus of elasticity of the cohesive inorganic filler particles is 48 MPa or higher, and in which a proportion of the number of cohesive inorganic filler particles, of the cohesive inorganic filler particles which are included in the heat dissipation sheet and are present at an interface between the heat dissipation sheet and the metal substrate, satisfying the following conditions E and F is 60% or more with respect to a total number of the cohesive inorganic filler particles present at the interface between the heat dissipation sheet and the metal substrate.

Condition E: an aspect ratio expressed by a ratio of a major diameter to a minor diameter (major diameter/minor diameter) is within a range of a number larger than 1 and less than or equal to 2

Condition F: in an observation of a cross section of the heat dissipation sheet in a thickness direction, in triangles formed to have one side which is a straight line constituted by a contact interface between the metal substrate and a cohesive inorganic filler particle and an apex which is a center of a virtual circle having a largest diameter of the cohesive inorganic filler particle as a diameter, an angle $\theta_2$ formed by connecting both ends of the straight line to the apex becomes 30 degrees or larger (5) In the heat dissipation member according to (4), the cohesive inorganic filler particles are boron nitride cohesive particles having a house-of-cards structure.

(6) A semiconductor device is provided, including the heat dissipation sheet according to any one of (1) to (3), or the heat dissipation member according to (4) or (5).

Advantageous Effects of Invention

According to the present invention, it is possible to provide a heat dissipation sheet and a heat dissipation member having excellent heat conduction properties and insulation properties. When the heat dissipation sheet or the heat dissipation member having excellent heat conduction properties is used in a semiconductor device, it is possible to provide favorable heat dissipation properties even to a power device which generates a large amount of heat.

DESCRIPTION OF EMBODIMENTS

In this specification, the term "to" indicating a numerical range denotes that numerical values disclosed before and after thereof are included as a lower limit value and an upper limit value.

Hereinafter, the present invention will be described in detail. However, description of constituent requirements which will be disclosed below is an example (representative example) of an embodiment of the present invention. The present invention is not limited to the details thereof and can be performed in various deformations within a range of the gist thereof.

Figure 1:
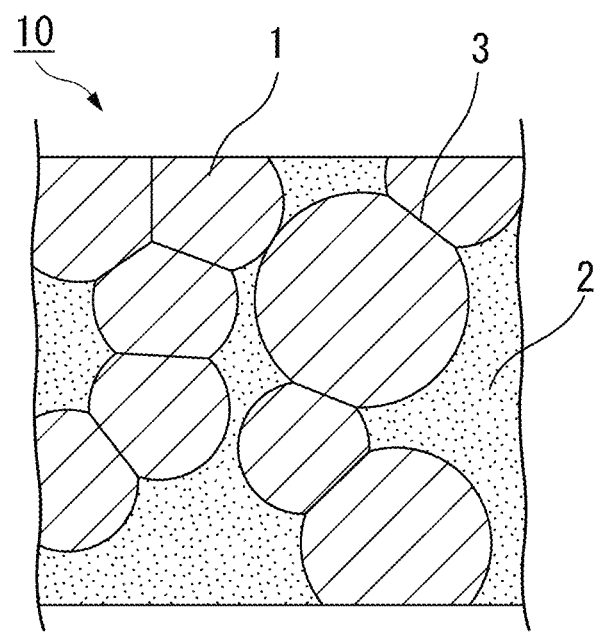
FIG. 1 is a schematic view of an enlarged cross section of a heat dissipation sheet 10 according to an embodiment.
Figure 2:
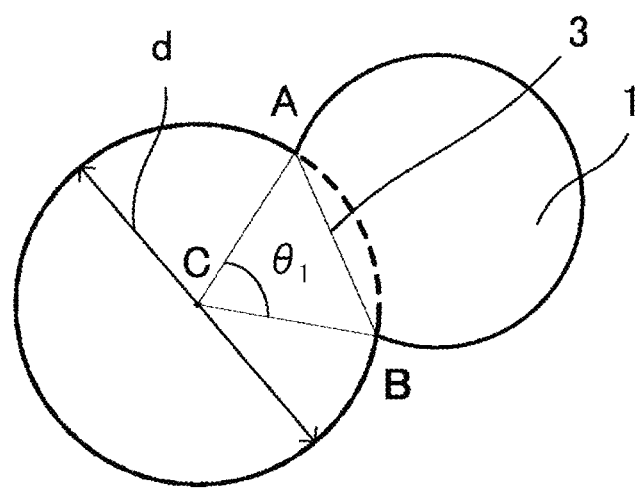
FIG. 2 is a schematic view of enlarged cross sections of cohesive inorganic filler particles in which a contact interface has a straight line part.
Figure 3:
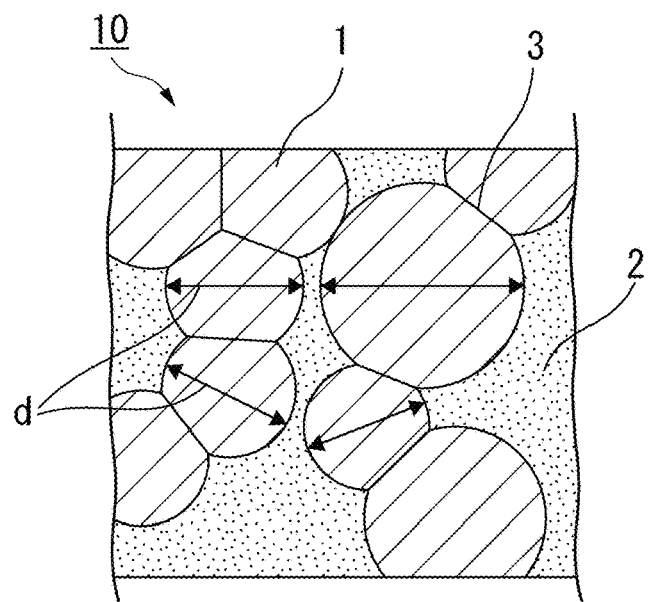
FIG. 3 is a schematic view of cross sections showing largest diameters of cohesive inorganic filler particles.
Figure 4:
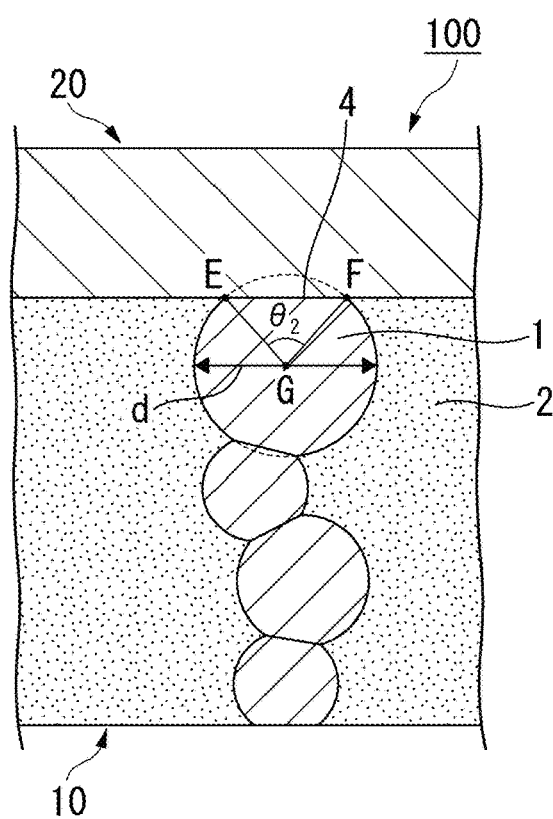
FIG. 4 is a schematic view of an enlarged cross section of a heat issipation member 100 according to the embodiment.

In FIGS. 2 to 4 be described below, the same reference signs are applied to the same constituent elements as those in FIG. 1, and description thereof will be omitted.

First Aspect

A heat dissipation sheet according to an embodiment of a first aspect of the present invention is a heat dissipation sheet including cohesive inorganic filler particles and a resin and is characterized by a cross section of the heat dissipation sheet in a thickness direction.

The breaking strength of the cohesive inorganic filler particles used in the present invention is 20 MPa or lower, preferably 15 MPa or lower, and more preferably 10 MPa or lower. When the breaking strength exceeds the foregoing upper limit value, even if pressing is performed during a sheet-making process (which will be described below), the cohesive inorganic filler particles are less likely to be deformed and the cohesive inorganic filler particles come into point contact with each other. If the breaking strength is equal to or smaller than the foregoing upper limit value, cohesive structures of the cohesive inorganic filler particles are deformed and the cohesive inorganic filler particles are likely to come into surface contact with each other at the time of pressing. On the other hand, the lower limit value for the breaking strength is not particularly limited. However, in regard to facilitating handling, normally, the breaking strength is preferably 2.5 MPa or higher, more preferably 3.0 MPa or higher, further preferably 3.5 MPa or higher, and particularly preferably 4.0 MPa or higher.

In addition, the modulus of elasticity of the cohesive inorganic filler particles is 48 MPa or higher, preferably 50 MPa or higher, and more preferably 55 MPa or higher. If the modulus of elasticity is equal to or larger than the foregoing lower limit value, the cohesive inorganic filler particles are subjected to plastic deformation in a direction of a pressing pressure, and thus collapse of the cohesive structure can be prevented. On the other hand, the upper limit value for the modulus of elasticity is not particularly limited. However, in regard to easily obtaining sufficient deformation, normally, the modulus of elasticity is preferably 2,000 MPa or lower, more preferably 1,500 MPa or lower, and further preferably 1,000 MPa or lower.

In this manner, since the cohesive inorganic filler particles have a high modulus of elasticity, spherical shapes can be maintained at the time of pressing. Since the breaking strength is 20 MPa or lower, a part in which cohesive inorganic filler particles are in contact with each other can be deformed and allows surface contact therebetween. For this reason, while high heat conductivity inside the cohesive inorganic filler particles is maintained, contact thermal resistance at interfaces between the cohesive inorganic filler particles and an interface between a metal substrate (which will be described below) and the heat dissipation sheet can be reduced, and the heat conductivity of the entirety can be improved.

Due to the above reasons, the breaking strength of the cohesive inorganic filler particles is preferably within a range of 2.5 to 20 MPa, more preferably within a range of 3.0 to 20 MPa, further preferably within a range of 3.5 to 15 MPa, and particularly preferably within a range of 4.0 to 10 MPa.

In addition, the modulus of elasticity of the cohesive inorganic filler particles is preferably within a range of 48 to 2,000 MPa, more preferably within a range of 50 to 1,500 MPa, and further preferably within a range of 55 to 1,000 MPa.

When the cohesive inorganic filler particles are in the heat dissipation sheet, the breaking strength and the modulus of elasticity of the cohesive inorganic filler particles can be measured by baking the resin of the heat dissipation sheet and taking out the cohesive inorganic filler particles such that these cohesive inorganic filler particles are not altered. A measurement method is as disclosed in examples.

The cohesive inorganic filler particles contained in the heat dissipation sheet can be used without limitation as long as they are cohesive inorganic filler particles having heat conduction properties. However, from the viewpoint of excellent heat conduction properties, it is preferable that they be boron nitride cohesive particles. Particularly among these, from the viewpoint of the breaking strength and the modulus of elasticity of the cohesive inorganic filler particles, it is more preferable that they be boron nitride cohesive particles having a house-of-cards structure. For example, "a house-of-cards structure" is disclosed in Ceramics 43 No. 2 (2008, published by Ceramic Society of Japan) and is a structure in which plate-shaped particles are stacked in a complicated manner without having any orientation. More specifically, boron nitride cohesive particles having a house-of-cards structure indicate aggregates of boron nitride primary particles, that is, boron nitride cohesive particles having a structure in which flat surface portions and end surface portions of primary particles come into contact with each other and T-shaped associated bodies are formed, for example.

The cohesive form of the cohesive inorganic filler particles can be checked with a scanning electron microscope (SEM).

Hereinafter, a case in which the cohesive inorganic filler particles are boron nitride cohesive particles will be described as an example.

When the cohesive inorganic filler particles are boron nitride cohesive particles, normally, the peak intensity ratio of a 100 axis to a 004 axis (I(100)/I(004)) in X-ray diffraction (XRD) measurement is preferably 3.0 or larger, more preferably 3.1 or larger, further preferably 3.2 or larger, and particularly preferably 3.3 or larger. The upper limit value is not particularly limited. However, normally, the peak intensity ratio (I(100)/I(004)) is preferably 10 or smaller. If the peak intensity ratio (I(100)/I(004)) is equal to or larger than the foregoing lower limit value, heat dissipation properties in the perpendicular direction can be enhanced at the time of sheet molding. If the peak intensity ratio (I(100)/I(004)) is equal to or smaller than the foregoing upper limit value, the cohesive inorganic filler particles are less likely to collapse at the time of sheet molding, and thus heat dissipation properties can be further enhanced.

Due to the above reasons, the peak intensity ratio (I(100)/I(004)) is preferably within a range of 3.0 to 10, more preferably within a range of 3.1 to 10, further preferably within a range of 3.2 to 10, and particularly preferably 3.3 to 10.

Also, when the cohesive inorganic filler particles are boron nitride cohesive particles, the breaking strength is 20 MPa or lower as described above, preferably 15 MPa or lower, and further preferably 10 MPa or lower. The same applies to the lower limit value as described above. Normally, the breaking strength is preferably 2.5 MPa or higher, more preferably 3.0 MPa or higher, further preferably 3.5 MPa or higher, and particularly preferably 4.0 MPa or higher.

Normally, when the cohesive inorganic filler particles are boron nitride cohesive particles, the specific surface area is preferably 1 m$^2$/g or larger, more preferably within a range of 3 m$^2$/g to 50 m$^2$/g, and further preferably within a range of 5 m$^2$/g to 40 m$^2$/g. If the specific surface area is equal to or larger than the foregoing lower limit value, when the boron nitride cohesive particles come into contact with each other, surface parts of the boron nitride cohesive particles are easily deformed, and contact resistance between the boron nitride cohesive particles can be reduced. If the specific surface area is equal to or smaller than the foregoing upper limit value, the viscosity of a resin composition (a composition for a sheet, which will be described below) containing the boron nitride cohesive particles can be reduced.

When the cohesive inorganic filler particles are boron nitride cohesive particles, the shapes thereof are preferably spherical shapes. If the shapes of the boron nitride cohesive particles are spherical shapes, they have excellent isotropy, and thus they have uniform heat conduction in all directions. In "a spherical shape", an aspect ratio expressed by the ratio of a major diameter to a minor diameter (major diameter/minor diameter) is within a range of a number larger than 1 and less than or equal to 2, preferably within a range of a number larger than 1 and less than or equal to 1.75, more preferably within a range of a number larger than 1 and less than or equal to 1.5, and further preferably within a range of a number larger than 1 and less than or equal to 1.4. The aspect ratio of the boron nitride cohesive particles is determined by obtaining the ratio of the major diameter to the minor diameter of each of the boron nitride cohesive particles from an image captured by a scanning electron microscope (SEM).

When the cohesive inorganic filler particles are boron nitride cohesive particles, normally, a maximum particle diameter $D_{max}$ (which may be simply termed "a maximum particle diameter" in this specification) on the basis of the volume thereof is preferably 2 μm or longer, more preferably 3 μm or longer, further preferably 5 μm or longer, and particularly preferably 10 μm or longer. In addition, normally, the maximum particle diameter is preferably 300 μm or shorter, more preferably 200 μm or shorter, further preferably 100 μm or shorter, and particularly preferably 90 μm or shorter. When the maximum particle diameter is within the foregoing ranges, it is possible to obtain a heat dissipation sheet having sufficient heat conductivity in the thickness direction of the heat dissipation sheet and having favorable voltage withstand characteristics as well.

Due to the above reasons, when the cohesive inorganic filler particles are boron nitride cohesive particles, the maximum particle diameter is preferably within a range of 2 to 300 μm, more preferably within a range of 3 to 200 μm, further preferably within a range of 5 to 100 μm, and particularly preferably within a range of 10 to 90 μm.

In addition, when the cohesive inorganic filler particles are boron nitride cohesive particles, there is no particular limitation for an average particle diameter $D_{50}$ (which may hereinafter be simply termed "an average particle diameter") on the basis of the volume thereof. Due to a reason similar to that for the value of the foregoing maximum particle diameter on the basis of volume, normally, the average particle diameter is preferably 1 μm or longer, more preferably 2 μm or longer, further preferably 3 μm or longer, and particularly preferably 5 μm or longer. In addition, normally, the average particle diameter is preferably 250 μm or shorter, more preferably 150 μm or shorter, further preferably 90 μm or shorter, and particularly preferably 70 μm or shorter. When the average particle diameter is within the foregoing ranges, it is possible to obtain a heat dissipation sheet having sufficient heat conductivity in the thickness direction of the heat dissipation sheet and having favorable voltage withstand characteristics as well.

Due to the above reasons, when the cohesive inorganic filler particles are boron nitride cohesive particles, the average particle diameter is preferably within a range of 1 to 250 μm, more preferably within a range of 2 to 150 μm, further preferably within a range of 3 to 90 μm, and particularly preferably within a range of 5 to 70 μm.

For example, the maximum particle diameter and the average particle diameter described above can be measured by dispersing cohesive inorganic filler particles in a suitable solution using a laser diffraction/scattering-type particle size distribution measuring device. Specifically, with respect to a sample in which cohesive inorganic filler particles are dispersed in a pure water medium containing sodium hexametaphosphate as a dispersion stabilizer, the particle size distribution is measured with a laser diffraction/scattering-type particle size distribution measuring device (for example, product name "LA-920" manufactured by HORIBA, LTD.), and the maximum particle diameter and the average particle diameter of the cohesive inorganic filler particles can be obtained from the obtained particle size distribution.

For example, boron nitride cohesive particles can be manufactured by methods disclosed in Japanese Unexamined Patent Application, First Publication No. 2015-193752, Japanese Unexamined Patent Application, First Publication No. 2015-195287, Japanese Unexamined Patent Application, First Publication No. 2015-195292, and the like.

As a resin (which will hereinafter be referred to as "a matrix resin") for forming a heat dissipation sheet, both a curable resin and a thermoplastic resin can be used without limitation.

The complex viscosity of the matrix resin is not particularly limited. However, at 100° C., it is preferably 45 Pa·s or lower, more preferably 43 Pa·s or lower, and further preferably 40 Pa·s or lower. In addition, at 100° C., the complex viscosity of the matrix resin is preferably 5 Pa·s or higher and more preferably 8 Pa·s or higher. If the complex viscosity of the matrix resin is within the foregoing ranges, the matrix resin does not hinder deformation of the cohesive inorganic filler particles caused by breakage or the like at a contact interface therebetween at the time of press molding, and thus there is a tendency for the cohesive inorganic filler particles to easily satisfy conditions A to E (which will be described below).

Due to the above reasons, at 100° C., the complex viscosity of the matrix resin is preferably within a range of 5 to 45 Pa·s, more preferably within a range of 5 to 43 Pa·s, and further preferably within a range of 8 to 40 Pa·s.

A method of measuring the complex viscosity of a matrix resin is not particularly limited. The complex viscosity of the matrix resin can be measured using a viscoelasticity-measuring device, for example. Specifically, a disk-shaped plate (diameter: 10 mm) is used as a jig, a matrix resin (0.1 g) is sandwiched between two jigs held at a distance (0.5 mm) between the jigs, and the complex viscosity of the matrix resin is measured using a viscoelasticity-measuring device under conditions of a distortion of 0.3%, a measurement temperature of 100° C., and a measurement frequency of 1 Hz.

The glass transition temperature (which will hereinafter be referred to as "a Tg of a matrix resin") of the matrix resin is not specifically limited. Normally, the Tg of the matrix resin is preferably 0° C. or higher, more preferably 10° C. or higher, and further preferably 25° C. or higher. In addition, normally, the Tg of the matrix resin is preferably 400° C. or lower, more preferably 350° C. or lower, and further preferably 300° C. or lower. If the Tg of the matrix resin is equal to or larger than the foregoing lower limit value, the modulus of elasticity does not become excessively low, and the matrix resin tends to be able to curb deformation when it is used at a high temperature. If the Tg of the matrix resin is equal to or smaller than the foregoing upper limit value, the occurrence of cracks caused by mechanical impacts is curbed, and the matrix resin tends to be able to have reduced insulation failure.

Due to the above reasons, the Tg of the matrix resin is preferably within a range of 0° C. to 400° C., more preferably within a range of 10° C. to 350° C., and further preferably within a range of 25° C. to 300° C.

A method of measuring the Tg of the matrix resin is not particularly limited. For example, the Tg of the matrix resin can be measured using a differential scanning calorimeter (DSC), a dynamic viscoelasticity-measuring device (DMS), or a thermomechanical analysis device (TMA).

When a DSC is used, specifically, measurement is performed on the basis of the method disclosed in JIS K 7121 under a nitrogen atmosphere, at a rate of temperature rise of 10° C./min, and a measurement temperature range within a range of −20° C. to 500° C. Then, an intermediate point of a part indicating a step-like change in a DSC curve is adopted as the Tg of the matrix resin.

Regarding a curable resin which can be used as a matrix resin, a thermosetting resin, a photo-curable resin, an electron beam-curable resin, or the like can be used, and a thermosetting resin is preferably used.

For example, regarding a thermosetting resin, a resin exemplified in PCT International Publication No. WO2013/081061 can be used. Particularly, it is preferable to use an epoxy resin.

For example, regarding an epoxy resin, it is preferable to include a phenoxy resin having at least one skeleton selected from the group consisting of a bisphenol A-type skeleton, a bisphenol F-type skeleton, a bisphenol A/F mixture-type skeleton, a naphthalene skeleton, a fluorene skeleton, a biphenyl skeleton, an anthracene skeleton, a pyrene skeleton, a xanthene skeleton, an adamantane skeleton, and a dicyclopentadiene skeleton. Among these, it is more preferable for the foregoing phenoxy resin to have at least one kind of skeleton selected from the group consisting of a bisphenol A-type skeleton, a bisphenol F-type skeleton, a bisphenol A/F mixture-type skeleton, a naphthalene skeleton, a fluorene skeleton, and a biphenyl skeleton. It is further preferable to have at least one of a fluorene skeleton and a biphenyl skeleton. Heat-resisting properties of a cured product of a heat dissipation sheet can be further enhanced by using phenoxy resins having these preferable skeletons.

It is preferable for the foregoing phenoxy resin to have a polycyclic aromatic skeleton in a main chain. In addition, it is more preferable for the foregoing phenoxy resin to have at least one skeleton of the skeletons expressed by the following Formulae (1) to (6) in a main chain.

[Chem. 1]

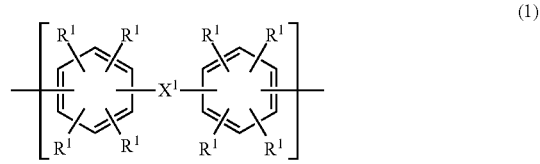

(1)

In the foregoing Formula (1), $R^1$ indicates a hydrogen atom, a hydrocarbon group having the number of carbon atoms within a range of 1 to 10, or a halogen atom; and $X^1$ indicates a single bond, a divalent hydrocarbon group having the number of carbon atoms within a range of 1 to 7, —O—, —S—, —SO$_2$—, or —CO—. In the foregoing Formula (1), a plurality of individuals of $R^1$ may be the same as or different from each other.

[Chem. 2]

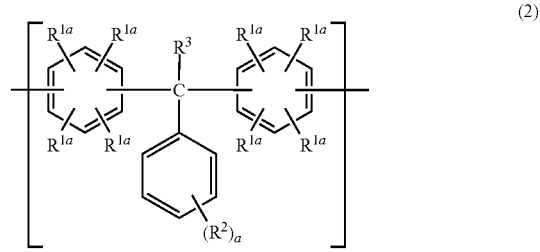

(2)

In the foregoing Formula (2), $R^{1a}$ indicates a hydrogen atom, a hydrocarbon group having the number of carbon atoms within a range of 1 to 10, or a halogen atom; $R^2$ indicates a hydrocarbon group having the number of carbon atoms within a range of 1 to 10 or a halogen atom; $R^3$ indicates a hydrogen atom or a hydrocarbon group having the number of carbon atoms within a range of 1 to 10; and m indicates an integer of 0 to 5. In the foregoing Formula (2), a plurality of individuals of $R^{1a}$ may be the same as or different from each other.

[Chem. 3]

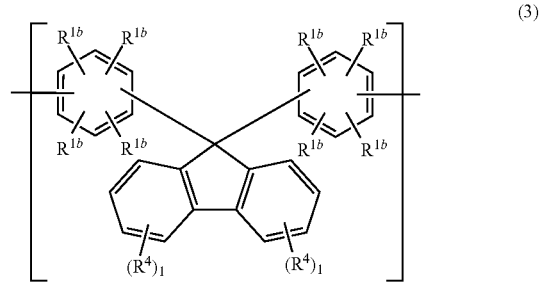

(3)

In the foregoing Formula (3), $R^{1b}$ indicates a hydrogen atom, a hydrocarbon group having the number of carbon atoms within a range of 1 to 10, or a halogen atom; $R^4$ indicates a hydrocarbon group having the number of carbon atoms within a range of 1 to 10 or a halogen atom; and 1 indicates an integer of 0 to 4. In the foregoing Formula (3), a plurality of individuals of $R^{1b}$ may be the same as or different from each other. In the foregoing Formula (3), a plurality of individuals of $R^4$ may be the same as or different from each other.

[Chem. 4]

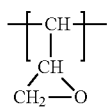
(4)

[Chem. 5]

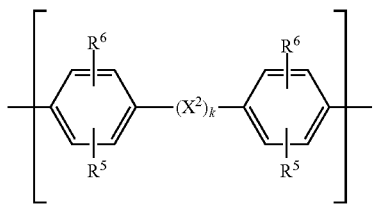
(5)

In the foregoing Formula (5), $R^5$ and $R^6$ indicate a hydrogen atom, an alkyl group having the number of carbon atoms within a range of 1 to 5, or a halogen atom; $X^2$ indicates $-SO_2-$, $-CH_2-$, $-C(CH_3)_2-$, or $-O-$; and k is 0 or 1.

[Chem. 6]

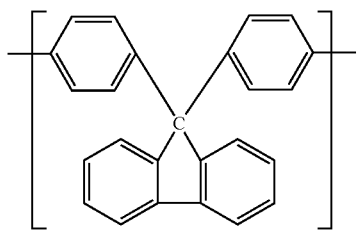
(6)

For example, regarding the foregoing phenoxy resin, a phenoxy resin expressed by the following Formula (7) is favorably used.

[Chem. 7]

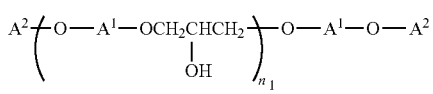
(7)

In the foregoing Formula (7), $A^1$ has a structure expressed by any of the foregoing Formulae (4) to (6), in which the structure expressed by the foregoing Formula (4) is within a range of 0 to 60 mol %, the structure expressed by the foregoing Formula (5) is within a range of 5 to 95 mol %, and the structure expressed by the foregoing Formula (6) is within a range of 5 to 95 mol % as constituents thereof; $A^2$ indicates a hydrogen atom or a group expressed by the following Formula (8); and $n_1$ indicates a number (average value) within a range of 25 to 500.

[Chem. 8]

(8)

The weight-average molecular weight of the foregoing phenoxy resin is preferably 10,000 or larger. A more preferable lower limit for the weight-average molecular weight of the phenoxy resin is 30,000, and a further preferable lower limit therefor is 40,000. A preferable upper limit for the weight-average molecular weight of the phenoxy resin is 1,000,000, and a more preferable upper limit therefore is 250,000. If the weight-average molecular weight of the phenoxy resin is equal to or larger than the foregoing lower limit value, thermal deterioration of the heat dissipation sheet is reduced, and film-making efficiency is also improved. If the weight-average molecular weight of the phenoxy resin is equal to or smaller than the foregoing upper limit value, mutual solubility between the phenoxy resin and other resins becomes favorable. As a result, heat-resisting properties of a cured product of a heat dissipation sheet and the stacked structure thereof are improved. Furthermore, the possibility of deterioration in heat conductivity and adhesive properties caused by incomplete curing can be reduced.

Due to the above reasons, the weight-average molecular weight of the phenoxy resin is preferably within a range of 10,000 to 1,000,000, more preferably within a range of 30,000 to 1,000,000, and further preferably within a range of 40,000 to 250,000.

The weight-average molecular weight of the phenoxy resin is a polystyrene-converted weight-average molecular weight obtained by performing gel permeation chromatography (GPC) measurement.

It is preferable for the heat dissipation sheet to include a low-molecular-weight epoxy resin having a weight-average molecular weight of 600 or smaller. An epoxy resin tends to have a higher viscosity as the molecular weight increases. If the weight-average molecular weight is equal to or smaller than the foregoing upper limit value, the resin is likely to infiltrate into gaps between the cohesive inorganic filler particles at the time of press molding. Thus, the gaps between the cohesive inorganic filler particles are reduced, and insulation properties tend to be more favorable.

If the heat dissipation sheet includes a low-molecular-weight epoxy resin, the viscosity of the resin in its entirety decreases, and thus the resin can sufficiently infiltrate into the gaps between the cohesive inorganic filler particles at the time of press molding.

The foregoing low-molecular-weight epoxy resin is not particularly limited as long as the weight-average molecular weight is 600 or smaller. Specific examples of a low-molecular-weight epoxy resin include an epoxy monomer having a bisphenol skeleton, an epoxy monomer having a dicyclopentadiene skeleton, an epoxy monomer having a naphthalene skeleton, an epoxy monomer having an adamantane skeleton, an epoxy monomer having a fluorene skeleton, an epoxy monomer having a biphenyl skeleton, an epoxy monomer having a bi-(glycidyloxyphenyl)methane skeleton, an epoxy monomer having a xanthene skeleton, an epoxy monomer having an anthracene skeleton, or an epoxy monomer having a pyrene skeleton. Only one kind of low-molecular-weight epoxy resin may be used, or two or more kinds thereof may be used together.

The heat dissipation sheet may include a different resin which does not correspond to the phenoxy resin and the low-molecular-weight epoxy resin described above. A different resin may be any one of or both of a thermoplastic resin and a thermosetting resin.

Examples of a thermoplastic resin include a nylon resin, a polyester resin, a polystyrene resin, a silicone resin, and a polyolefin resin.

Examples of a thermosetting resin include an epoxy resin, an acrylic resin, a melamine resin, a urea resin, a polyimide resin, and a polyurethane resin.

The heat dissipation sheet may include a curing agent. A curing agent included in the heat dissipation sheet is not particularly limited. Examples of a preferable curing agent include a phenol resin, an acid anhydride having an aromatic skeleton or an alicyclic skeleton, a hydrolysis product of this acid anhydride, and a modified product of this acid anhydride. When this preferable curing agent is used, it is possible to obtain a cured product of a heat dissipation sheet having an excellent balance between heat-resisting properties, moisture resistance, and electrical properties. Only one kind of curing agent may be used, or two or more kinds thereof may be used together.

In order to adjust a curing rate, physical properties of a cured product, or the like, it is preferable to use the foregoing curing agent and a curing accelerator together.

The foregoing curing accelerator is not particularly limited. The foregoing curing accelerator is suitably selected in accordance with the kind of resin or curing agent to be used. For example, specific examples of a curing accelerator include tertiary amines, imidazoles, imidazolines, triazines, an organophosphorus compound, quaternary phosphonium salts, and diazabicycloalkenes such as organic acid salts. In addition, examples of the foregoing curing accelerator include an organometallic compound, quaternary ammonium salts, and metal halides. Examples of the foregoing organometallic compound include zinc octylate, tin octylate, and an aluminum acetylacetone complex. These may be used alone as one kind or as a mixture of two or more kinds thereof.

As necessary, the heat dissipation sheet may include inorganic filler particles other than the cohesive inorganic filler particles (which will hereinafter be referred to as "other inorganic filler particles") as long as the effects of the present invention are not impaired. Other inorganic filler particles are not particularly limited as long as they do not cohere. Examples thereof include alumina (aluminum oxide), aluminum nitride, silicon nitride, zeolite, and silica.

In the heat dissipation sheet, when the cohesive inorganic filler particles are boron nitride (BN) cohesive particles, the peak intensity ratio of a (100) plane to a (004) plane ((100)/(004)) of BN primary particles in this sheet obtained through X-ray diffraction measurement is preferably 1.0 or larger, more preferably 1.5 or larger, further preferably 2.0 or larger, particularly preferably 2.5 or larger, and most preferably 3.0 or larger. There is no particular limitation for the upper limit. However, normally, the peak intensity ratio ((100)/(004)) is preferably 10.0 or smaller, more preferably 7.0 or smaller, and further preferably 5.0 or smaller.

If the peak intensity ratio ((100)/(004)) is equal to or smaller than the foregoing upper limit value, the proportion of ab planes of the BN primary particles directed in the perpendicular direction with respect to the sheet surface does not become excessively high, and minute cracks inside the sheet can be curbed when a molding process such as pressing is performed. Deterioration in electrical properties such as a withstand voltage tends to be able to be curbed by curbing the occurrence of such cracks. In addition, if the peak intensity ratio ((100)/(004)) is equal to or larger than the foregoing lower limit value, the proportion of the BN primary particles directed in the perpendicular direction with respect to the sheet surface does not become excessively low, and the heat conductivity tends to be high.

Due to the above reasons, the peak intensity ratio ((100)/(004)) may be within a range of 1.0 to 10.0, may be within a range of 1.0 to 7.0, may be within a range of 1.0 to 5.0, may be within a range of 1.5 to 10.0, may be within a range of 1.5 to 7.0, may be within a range of 1.5 to 5.0, may be within a range of 2.0 to 10.0, may be within a range of 2.0 to 7.0, may be within a range of 2.0 to 5.0, may be within a range of 2.5 to 10.0, may be within a range of 2.5 to 7.0, may be within a range of 2.5 to 5.0, may be within a range of 3.0 to 10.0, may be within a range of 3.0 to 7.0, and may be within a range of 3.0 to 5.0.

Moreover, when the cohesive inorganic filler particles are boron nitride (BN) cohesive particles, there is no particular limitation for the average crystallite diameter of the BN primary particles obtained from a (002) plane peak of the BN primary particles in this sheet obtained through X-ray diffraction measurement. Normally, the average crystallite diameter of the BN primary particles is preferably 300 Å or larger, more preferably 320 Å or larger, further preferably 375 Å or larger, still preferably 380 Å or larger, particularly preferably 390 Å or larger, and most preferably 400 Å or larger.

In addition, normally, the average crystallite diameter of the BN primary particles is preferably 5,000 Å or smaller, more preferably 2,000 Å or smaller, and further preferably 1,000 Å or smaller.

If the average crystallite diameter of the BN primary particles is equal to or smaller than the foregoing upper limit value, at the time of sheet molding such as a pressing process as well, the house-of-cards structures within the cohesive particles are maintained to a certain extent, the proportion of the ab planes of the BN primary particles directed in the perpendicular direction with respect to the sheet surface increases, and the heat conductivity tends to be high.

In addition, if the average crystallite diameter of the BN primary particles is equal to or larger than the foregoing lower limit value, enlargement in interfaces of the BN primary particles is curbed. Thus, resistance of heat transfer is reduced, and the heat conductivity tends to be high.

Due to the above reasons, the average crystallite diameter of the BN primary particles is preferably within a range of 300 to 5,000 Å, more preferably within a range of 320 to 5,000 Å, further preferably within a range of 375 to 5,000 Å, still preferably within a range of 380 to 5,000 Å, particularly preferably within a range of 390 to 2,000 Å, and most preferably within a range of 400 to 1,000 Å.

In the heat dissipation sheet, there is no particular limitation for the peak area intensity ratio of the (100) plane to the (004) plane ((100)/(004)) of the BN primary particles in this sheet obtained through X-ray diffraction measurement. Normally, the peak area intensity ratio ((100)/(004)) is preferably 0.6 or higher, more preferably 0.65 or higher, further preferably 0.7 or higher, still preferably 0.75 or higher, particularly preferably 0.8 or higher, and most preferably 0.85 or higher. In addition, there is no particular limitation for the upper limit. However, normally, the peak area intensity ratio ((100)/(004)) is preferably 10.0 or lower, more preferably 5.0 or lower, and further preferably 4.0 or lower.

If the peak area intensity ratio ((100)/(004)) is equal to or smaller than the foregoing upper limit value, the house-of-cards structures within cohesive particles are maintained to a certain extent, the proportion of the ab planes of the BN primary particles directed in the perpendicular direction with respect to the sheet surface increases, and the heat conductivity tends to be high. In addition, if the peak area intensity ratio ((100)/(004)) is equal to or larger than the foregoing lower limit value, enlargement in interfaces of the BN primary particles is curbed. Thus, resistance of heat transfer is reduced, and the heat conductivity tends to be high.

Due to the above reasons, the peak area intensity ratio ((100)/(004)) may be within a range of 0.6 to 10.0, may be within a range of 0.6 to 5.0, may be within a range of 0.6 to 4.0, may be within a range of 0.65 to 10.0, may be within a range of 0.65 to 5.0, may be within a range of 0.65 to 4.0, may be within a range of 0.7 to 10.0, may be within a range of 0.7 to 5.0, may be within a range of 0.7 to 4.0, may be within a range of 0.75 to 10.0, may be within a range of 0.75 to 5.0, may be within a range of 0.75 to 4.0, may be within a range of 0.8 to 10.0, may be within a range of 0.8 to 5.0, may be within a range of 0.8 to 4.0, may be within a range of 0.85 to 10.0, may be within a range of 0.85 to 5.0, and may be within a range of 0.85 to 4.0.

Regarding the peak area intensity ratio ((100)/(004)), an analysis program incidental to an XRD device for measuring may be used. For example, using "X'Pert Pro MPD powder X-ray diffractometer" (product name) manufactured by PANalytical LTD., the intensity ratio of a corresponding peak area can be calculated.

The heat dissipation sheet according to the present embodiment is characterized by a cross section of the heat dissipation sheet in the thickness direction. Specifically, half or more of the cohesive inorganic filler particles included in the heat dissipation sheet satisfy the following conditions A and B, and the cohesive inorganic filler particles satisfying the following conditions A and B satisfy the following condition C. Specifically, description will be given using FIG. 1.

Condition A: cohesive inorganic filler particles are in surface contact with each other Condition B: an aspect ratio expressed by a ratio of a major diameter to a minor diameter (major diameter/minor diameter) is within a range of a number larger than 1 and less than or equal to 2

Condition C: in an observation of a cross section of the heat dissipation sheet in a thickness direction, in triangles formed to have one side which is a straight line constituted by a contact interface between cohesive inorganic filler particles and an apex which is a center of a virtual circle having a largest diameter of the cohesive inorganic filler particle as a diameter, a sum $S_t$ of areas of triangles in which an angle $\theta_1$ formed by connecting both ends of the straight line to the apex becomes 30 degrees or larger is 20% or more with respect to a sum $S_h$ of cross-sectional areas of the cohesive inorganic filler particles FIG. 1 is a schematic view of an enlarged cross section of a heat dissipation sheet 10 according to the present embodiment.

The heat dissipation sheet 10 is formed by randomly disposing cohesive inorganic filler particles 1 in a matrix resin 2. Normally, the content of the cohesive inorganic filler particles 1 in the heat dissipation sheet 10 is preferably 5 weight % or more, more preferably 10 weight % or more, further preferably 15 weight % or more, and particularly preferably 20 weight % or more with respect to the total mass of the heat dissipation sheet 10. In addition, normally, the content of the cohesive inorganic filler particles 1 in the heat dissipation sheet 10 is preferably 90 weight % or less, more preferably 80 weight % or less, further preferably 70 weight % or less, and particularly preferably 60 weight % or less with respect to the total mass of the heat dissipation sheet 10.

Due to the above reasons, the content of the cohesive inorganic filler particles 1 in the heat dissipation sheet 10 is preferably within a range of 5 to 90 weight %, more preferably within a range of 10 to 80 weight %, further preferably within a range of 15 to 70 weight %, and particularly preferably within a range of 20 to 60 weight % with respect to the total mass of the heat dissipation sheet 10.

In half or more of the cohesive inorganic filler particles 1 included in the heat dissipation sheet 10, the cohesive inorganic filler particles are in surface contact with each other (condition A). That is, the heat dissipation sheet 10 is characterized by a contact interface 3 between the cohesive inorganic filler particles 1 forming a straight line part.

Since the heat dissipation sheet according to the present embodiment includes cohesive inorganic filler particles in a matrix resin, voids are likely to be generated at resin-filler particle interfaces after the sheet is made. In order to reduce this, pressing is performed in the thickness direction of the heat dissipation sheet. The voids in the heat dissipation sheet are reduced due to the pressing. On the other hand, a pressure is also applied to the cohesive inorganic filler particles in the heat dissipation sheet so that cohesive inorganic filler particles adjacent to each other come into surface contact with each other instead of coming into point contact. Further, these parts in surface contact with each other are observed as "straight line parts" in an observation of a cross section in the thickness direction. In addition, although it depends on the content of the cohesive inorganic filler particles, the shapes of the cohesive inorganic filler particles in the heat dissipation sheet may be polygonal shapes such as pentagonal shapes or hexagonal shapes.

In this manner, deformation occurs at the contact interface between the cohesive inorganic filler particles due to breakage or the like, and a straight line part is constituted. On the other hand, the cohesive structures themselves come into surface contact with each other without collapsing. Thus, contact between the cohesive inorganic filler particles increases, heat conduction paths in the thickness direction of the heat dissipation sheet are enlarged, and voids between the cohesive inorganic filler particles can also be reduced. Accordingly, a heat dissipation sheet having high heat dissipation performance and excellent insulation properties can be produced.

As long as such shapes can be realized in a heat dissipation sheet, the kind of cohesive inorganic filler particles is not specifically limited. However, it is preferable that the breaking strength of the cohesive inorganic filler particles not be excessively high and the filler particles themselves be cohesive inorganic filler particles having a sufficient modulus of elasticity. Specifically, the breaking strength of the cohesive inorganic filler particles is 20 MPa or lower, and the modulus of elasticity thereof is 48 MPa or higher. From this viewpoint, it is more preferable that the cohesive inorganic filler particles be boron nitride cohesive particles having a house-of-cards structure.

In addition, in an observation of a cross section of the heat dissipation sheet in the thickness direction, it is preferable that the angle $\theta_1$ formed between two intersections, of a virtual circle having the largest diameter of a cohesive inorganic filler particle (in which the contact interface constitutes a straight line part) as a diameter and this straight line part, and the center of this virtual circle be 30 degrees or larger. That is, in triangles formed to have one side which is a straight line constituted by a contact interface between cohesive inorganic filler particles and an apex which is the center of a virtual circle having the largest diameter of the cohesive inorganic filler particle as a diameter, it is preferable that the angle $\theta_1$ formed by connecting both ends of the straight line to the apex be 30 degrees or larger. This will be described based on FIG. 2.

The cohesive inorganic filler particles 1 in FIG. 2 are cohesive inorganic filler particles in which the contact interface constitutes a straight line part A-B. It is preferable that the angle $\theta_1$ formed between intersections A and B, of a virtual circle on the left side in the diagram having a largest diameter d of the cohesive inorganic filler particle as a diameter and the straight line part of the contact interface 3, and a center C of the virtual circle be 30 degrees or larger. This angle $\theta_1$ expresses the state of the original cohesive inorganic filler particles squashed due to contact between the filler particles. The angle $\theta_1$ may be 45 degrees or larger and may be 60 degrees or larger.

On the other hand, normally, the angle $\theta_1$ is preferably 180 degrees or smaller. It may be 135 degrees or smaller, may be 120 degrees or smaller, and may be 105 degrees or smaller.

Due to the above reasons, the angle $\theta_1$ may be within a range of 30 to 180 degrees, may be within a range of 30 to 135 degrees, may be within a range of 30 to 120 degrees, may be within a range of 30 to 105 degrees, may be within a range of 45 to 180 degrees, may be within a range of 45 to 135 degrees, may be within a range of 45 to 120 degrees, may be within a range of 45 to 105 degrees, may be within a range of 60 to 180 degrees, may be within a range of 60 to 135 degrees, may be within a range of 60 to 120 degrees, and may be within a range of 60 to 105 degrees.

In addition, since pressing is performed in order to reduce voids, it is preferable for the heat dissipation sheet to have few voids. The proportion of gaps in the heat dissipation sheet is preferably 10 volume % or lower, more preferably 5 volume % or lower, and further preferably 3 volume % or lower.

The state of contact between the cohesive inorganic filler particles in the heat dissipation sheet can be checked by cutting the cured heat dissipation sheet and observing a cross section thereof with an optical microscope or a scanning electron microscope.

In half or more of the cohesive inorganic filler particles included in the heat dissipation sheet, an aspect ratio expressed by a ratio of a major diameter to a minor diameter (major diameter/minor diameter) is within a range of a number larger than 1 and less than or equal to 2 (condition B). In the present embodiment, cohesive inorganic filler particles having an aspect ratio within a range of a number larger than 1 and less than or equal to 2 are regarded as filler particles in which "spherical shapes are maintained". According to a photograph of a cross section of a heat dissipation sheet, cohesive inorganic filler particles in which spherical shapes are maintained indicate that these filler particles maintain spherical shapes and primary particles making the cohesive structures retain isotropy. The aspect ratio of the cohesive inorganic filler particles maintaining spherical shapes is within a range of a number larger than 1 and less than or equal to 2, preferably within a range of a number larger than 1 and less than or equal to 1.75, more preferably within a range of 1 to 1.5, and further preferably within a range of 1 to 1.4.

The degree of surface contact between the cohesive inorganic filler particles in the heat dissipation sheet can be expressed by the indices shown below. That is, in an observation of a cross section of the heat dissipation sheet in the thickness direction, in triangles formed to have one side which is a straight line constituted by a contact interface between cohesive inorganic filler particles and an apex which is the center of a virtual circle having the largest diameter of the cohesive inorganic filler particle as a diameter, an angle formed by connecting both ends of the straight line to the apex is regarded as $\theta_1$. When the sum of areas of triangles, of the cohesive inorganic filler particles satisfying the conditions A and B, in which the angle $\theta_1$ becomes 30 degrees or larger is regarded as $S_t$, the degree of surface contact between the cohesive inorganic filler particles satisfying the conditions A and B in the heat dissipation sheet can be expressed with the numerical value of the sum $S_t$ with respect to the sum Sit of cross-sectional areas of the cohesive inorganic filler particles satisfying the conditions A and B.

Here, "a straight line" in "a straight line constituted by a contact interface" need not be a straight line in a mathematically strict sense and denotes a state in which cohesive inorganic filler particles in contact with each other break and/or are deformed substantially in a straight line shape. Regarding a way of drawing the straight line, a straight line connecting points where adjacent cohesive inorganic filler particles begin to come into contact with each other may be taken into consideration.

In addition, when inorganic filler particles of a different kind having a different size are partially present between the cohesive inorganic filler particles, boron nitride particles having a larger particle diameter are used as the cohesive inorganic filler particles, for example. When other small inorganic filler particles, for example, alumina particles having a diameter which is 1/10 of that of the cohesive inorganic filler particles or smaller are also used in order to improve the filling rate of the inorganic filler particles, alumina having a smaller particle diameter may be partially sandwiched therebetween at interfaces between boron nitride particles, which are the cohesive inorganic filler particles. Even if particles such as alumina having a smaller particle diameter are included, it is not considered that the straight line is disconnected and thereby the central angle (angle $\theta_1$) becomes smaller than 30 degrees.

A method of obtaining the sum $S_h$ and the sum $S_t$ is not particularly limited. Examples thereof include a method of utilizing image analysis software and a method of measuring the weight by performing printing on paper.

When the degree of surface contact between the cohesive inorganic filler particles, that is, the numerical value of the sum $S_t$ with respect to the sum $S_h$ ($S_t/S_h$) increases, contact between the cohesive inorganic filler particles increases, the heat conduction paths in the thickness direction of the heat dissipation sheet are enlarged, and voids between the filler particles can be reduced so that insulation properties can be improved. Therefore, as the numerical value of $S_t/S_h$ increases, heat dissipation properties and insulation properties of the heat dissipation sheet are further improved, which is preferable.

Thus, in the present embodiment, in the cohesive inorganic filler particles satisfying the conditions A and B, the sum $S_t$ is 20% or more with respect to the sum $S_h$ (that is, $S_t/S_h$ is 20% or more) (condition C). The ratio $S_t/S_h$ is preferably 23% or more, more preferably 25% or more, and further preferably 30% or more. On the other hand, from the viewpoint of dimensional stability of the sheet shape at the time of press molding, normally, the ratio $S_t/S_h$ is preferably 99% or less, more preferably 95% or less, and further preferably 80% or less.

Due to the above reasons, the ratio $S_t/S_h$ may be within a range of 20% to 99%, may be within a range of 20% to 95%, may be within a range of 20% to 80%, may be within a range of 23% to 99%, may be within a range of 23% to 95%, may be within a range of 23% to 80%, may be within a range of 25% to 99%, may be within a range of 25% to 95%, may be within a range of 25% to 80%, may be within a range of 30% to 99%, may be within a range of 30% to 95%, and may be within a range of 30% to 80%.

The numerical value of the ratio $S_t/S_h$ can be adjusted in accordance with the breaking strength of the cohesive inorganic filler particles, the modulus of elasticity of the cohesive inorganic filler particles, the content of the cohesive inorganic filler particles in the heat dissipation sheet, the composition of the resin, the pressing pressure at the time of manufacturing a heat dissipation sheet, or the like.

Hereinafter, a method of manufacturing the heat dissipation sheet according to the present embodiment will be described. As long as a heat dissipation sheet having the foregoing shape can be obtained, a method of manufacturing this is not specifically limited. For example, PCT international Publication No. WO2015/119198 can be suitably referred to.

A heat dissipation sheet can be obtained by coating a surface of a substrate with a composition for a sheet, for example, performing drying, and then making it into a sheet.

<Preparation for Composition for Sheet>

A composition for a sheet can be obtained by uniformly mixing in the foregoing cohesive inorganic filler particles and a resin; and as necessary, other inorganic filler particles, a curing agent, a curing accelerator, or different components other than these as formulation components through agitating or kneading. For example, a mixer, a kneader, and a general kneading device such as a single/dual-shaft kneading machine can be used for mixing in the formulation components, and heating may be performed as necessary during mixing.

When the composition for a sheet includes a resin or a solvent in a liquid state, or the like so that the composition for a sheet is in a slurry state (which will also be referred to as "a coating slurry" in this specification) having fluidity, a preparation method for a slurry is not particularly limited, and a known method in the related art can be used. At this time, for the purpose of improvement in uniformity of the coating slurry, degassing, or the like, it is preferable to mix in and agitate each of the formulation components using a paint shaker, a bead mill, a planetary mixer, an agitating disperser, a rotation/revolution agitating mixer, a triple-roll mill, a kneader, a general kneading device such as a single/dual-shaft kneading machine, or the like.

An order of mixing in each of the formulation components is also arbitrary unless there is any specific problem such as the occurrence of reaction or precipitates. For example, a coating slurry can be prepared as follows.

First, a resin liquid is prepared by mixing in and dissolving a resin in an organic solvent (for example, methyl ethyl ketone, or cyclohexane). The cohesive inorganic filler particles, and as necessary, a mixture in which other inorganic filler particles and other components of one or more kinds are sufficiently mixed in are added to the obtained resin liquid and are mixed therewith. Thereafter, an organic solvent for adjusting the viscosity is further added and mixed in. Thereafter, an additive such as a resin curing agent, a curing accelerator, or a dispersant is further added and mixed in, thereby obtaining a coating slurry.

<Coating Process>

First, a surface of a substrate which has been prepared separately is coated with a coating slurry.

That is, a surface of a substrate is coated with a coating slurry by a dipping method, a spin coating method, a spray coating method, a blade method, or other arbitrary methods. When coating is performed with a coating slurry, a coating film having a predetermined film thickness can be uniformly formed on a substrate using a coating device such as a spin coater, a slit coater, a die coater, a blade coater, a comma coater, screen printer, a doctor blade, an applicator, or a spray coater. Among these coating devices, a blade coater capable of adjusting a gap is preferably used.

Examples of a substrate include a metal substrate and a plastic substrate (which will also be referred to as a plastic film).

<Drying Process>

Next, the coating slurry coating the surface of the substrate is dried, and a dried coating product (coating film) is obtained.

Normally, the drying temperature is preferably 15° C. or higher, more preferably 20° C. or higher, and further preferably 23° C. or higher. In addition, normally, the drying temperature is preferably 100° C. or lower, more preferably 90° C. or lower, further preferably 80° C. or lower, and particularly preferably 70° C. or lower.

In addition, the drying time is not particularly limited. However, normally, it is preferably 5 minutes or longer, more preferably 30 minutes or longer, further preferably 1 hour or longer, and particularly preferably 2 hours or longer. In addition, normally, the drying time is preferably 168 hours or shorter, more preferably 144 hours or shorter, further preferably 120 hours or shorter, and particularly preferably 96 hours or shorter.

Due to the above reasons, the drying time is preferably within a range of 5 minutes to 168 hours, more preferably within a range of 30 minutes to 144 hours, further preferably within a range of 1 to 120 hours, and particularly preferably within a range of 2 to 96 hours.

The film thickness of the heat dissipation sheet before being dried is suitably set depending on the assembled device. Normally, it is preferably 50 μm or longer, more preferably 100 μm or longer, further preferably 150 μm or longer, particularly preferably 300 μm or longer. In addition, normally, the film thickness of the heat dissipation sheet before being dried is preferably 800 μm or shorter, more preferably 700 μm or shorter, further preferably 600 μm or shorter, and particularly preferably 500 μm or shorter.

Due to the above reasons, the film thickness of the heat dissipation sheet before being dried is preferably within a range of 50 to 800 μm, more preferably within a range of 100 to 700 μm, further preferably within a range of 150 to 600 μm, and particularly preferably within a range of 300 to 500 μm.

<Sheet-Making Process>

After the drying process, a process of pressurizing and molding the dried coating product (sheet-making process) is performed.

When the substrate is a metal substrate, it is preferable to stack another metal substrate on the dried coating product and pressurize the stacked substrates. In addition, the dried coating product may be cut into pieces having a predetermined size before or after pressurizing.

When the substrate is a plastic film, it is preferable to stack another plastic film on the dried coating product and pressurize the stacked films. Thereafter, it is preferable that the plastic film be peeled off, metal substrates be respectively stacked on both surfaces of the pressurized dried coating product, and the stacked substrates be pressurized again, or it is preferable that one side of the pressurized dried coating product be temporarily adhered to a metal substrate and then they be pressurized again. Since they are pressurized again, the dried coating product is adhered to the metal substrate. In addition, the dried coating product may be cut into pieces having a predetermined size before or after first pressurizing.

Normally, the heating temperature (pressing temperature) during a process of making a sheet is preferably 0° C. or higher, more preferably 20° C. or higher. In addition, normally, the pressing temperature is preferably 300° C. or lower, more preferably 250° C. or lower, and further preferably 200° C. or lower.

Due to the above reasons, the pressing temperature is preferably within a range of 0° C. to 300° C., more preferably within a range of 20° C. to 250° C., and further preferably within a range of 20° C. to 200° C.

The pressing method in the foregoing sheet-making process (which will hereinafter be referred to as "pressing") can be performed using a known technology. For example, molding can be performed by a known method such as isostatic pressing, vacuum pressing, belt pressing, heating pressing, servo pressing, or calendar rolling.

Normally, the pressing pressure at the time of pressurizing the dried coating product on a plastic film or a metal substrate is preferably 10 kgf/cm$^2$ or higher, more preferably 150 kgf/cm$^2$ or higher, further preferably 200 kgf/cm$^2$ or higher, and particularly preferably 250 kgf/cm$^2$ or higher. In addition, normally, the pressing pressure is preferably 2,000 kgf/cm$^2$ or lower, more preferably 1,000 kgf/cm$^2$ or lower, further preferably 900 kgf/cm$^2$ or lower, and particularly preferably 800 kgf/cm$^2$ or lower.

Due to the above reasons, normally, the pressing pressure is preferably within a range of 10 to 2,000 kgf/cm$^2$, more preferably within a range of 150 to 1,000 kgf/cm$^2$, further preferably within a range of 200 to 900 kgf/cm$^2$, and particularly preferably within a range of 250 to 800 kgf/cm$^2$.

Regarding the heat dissipation sheet of the present embodiment, since a circuit board having a heat dissipation sheet in which copper is coated on both surfaces has a heat dissipation effect due to excellent heat conduction properties unprecedented in the related art and allows a device to have a high output and a high density with high reliability, the heat dissipation sheet of the present embodiment is suitable for a heat dissipation board or a heat dissipation sheet of a semiconductor device, particularly, an apparatus with a power semiconductor device. An apparatus with a power semiconductor device includes the heat dissipation sheet of the present embodiment. However, except for the heat dissipation sheet of the present embodiment, known members in the related art can be suitably employed as members such as an aluminum wiring, a sealing material, a package material, a heat sink, a thermal paste, and a solder.

In addition, there is no particular limitation for the heat conductivity (W/mK) of the heat dissipation sheet. Normally, it is preferably 5 W/mK or higher, more preferably 10 W/mK or higher, further preferably 13 W/mK or higher, particularly preferably 15 W/mK or higher, and most preferably 17 W/mK or higher.

Normally, the withstand voltage performance is preferably 10 kV/mm or higher, more preferably 15 kV/mm or higher, and further preferably 20 kV/mm or higher.

In addition, the glass transition temperature of the heat dissipation sheet is not specifically limited. However, normally, it is preferably 0° C. or higher, more preferably 10° C. or higher, and further preferably 25° C. or higher. In addition, normally, the glass transition temperature of the heat dissipation sheet is preferably 400° C. or lower, more preferably 350° C. or lower, and further preferably 300° C. or lower.

In addition, there is no particular limitation for the adhesive strength (N/cm) of the heat dissipation sheet. Normally, it is preferably 0.5 N/cm or higher, more preferably 1 N/cm or higher, further preferably 2 N/cm or higher, particularly preferably 3 N/cm or higher, and most preferably 5 N/cm or higher.

The heat dissipation sheet according to the embodiment of the first aspect of the present invention described above includes particular cohesive inorganic filler particles and a resin, and half or more of the cohesive inorganic filler particles included in the heat dissipation sheet satisfy the conditions A and B, and the cohesive inorganic filler particles satisfying the conditions A and B satisfy the condition C, thereby having excellent heat conduction properties and insulation properties. When the heat dissipation sheet having excellent heat conduction properties is used in a semiconductor device, it is possible to provide favorable heat dissipation properties even to a power device which generates a large amount of heat.

Second Aspect

A heat dissipation sheet according to an embodiment of a second aspect of the present invention is a heat dissipation sheet including cohesive inorganic filler particles and a resin and is characterized by a cross section of the heat dissipation sheet in the thickness direction.

The heat dissipation sheet according to the embodiment of the second aspect of the present invention is similar to the heat dissipation sheet according to the embodiment of the first aspect of the present invention except that half or more of the cohesive inorganic filler particles included in the heat dissipation sheet satisfy the following conditions A and B, and the cohesive inorganic filler particles satisfying the following conditions A and B satisfy the following condition D. The conditions A and B are similar to those of the first aspect. In addition, the manufacturing method is also similar to that of the first aspect.

Condition A: cohesive inorganic filler particles are in surface contact with each other Condition B: an aspect ratio expressed by a ratio of a major diameter to a minor diameter (major diameter/minor diameter) is within a range of a number larger than 1 and less than or equal to 2

Condition D: in an observation of a cross section of the heat dissipation sheet in a thickness direction, a sum $S_h$ of cross-sectional areas of the cohesive inorganic filler particles is 90% or less with respect to a sum $S_v$ of areas of virtual circles having a largest diameter of the cohesive inorganic filler particle as a diameter Since the heat dissipation sheet according to the present embodiment includes cohesive inorganic filler particles in a matrix resin, voids are likely to be generated at resin-filler particle interfaces after the sheet is made. In order to reduce this, pressing is performed in the thickness direction of the heat dissipation sheet. The voids in the heat dissipation sheet are reduced due to the pressing. On the other hand, a pressure is also applied to the cohesive inorganic filler particles in the heat dissipation sheet so that cohesive inorganic filler particles adjacent to each other come into surface contact with each other instead of coming into point contact. Further, these parts in surface contact with each other are observed as "parts having a decreased area due to deformation compared to that before being pressed" in an observation of a cross section in the thickness direction. In addition, although it depends on the content of the cohesive inorganic filler particles, the shapes of the cohesive inorganic filler particles in the heat dissipation sheet may be polygonal shapes such as pentagonal shapes or hexagonal shapes.

In this manner, deformation occurs at the contact interface between the cohesive inorganic filler particles due to breakage or the like, and the area thereof decreases. On the other hand, the cohesive structures themselves come into surface contact without collapsing. Thus, contact between the cohesive inorganic filler particles increases, the heat conduction paths in the thickness direction of the heat dissipation sheet are enlarged, and voids between the cohesive inorganic filler particles can also be reduced. Accordingly, a heat dissipation sheet having high heat dissipation performance and excellent insulation properties can be produced.

As long as such shapes can be realized in a heat dissipation sheet, the kind of cohesive inorganic filler particles is not specifically limited. However, it is preferable that the breaking strength of the cohesive inorganic filler particles not be excessively high and the filler particles themselves be cohesive inorganic filler particles having a sufficient modulus of elasticity. Specifically, the breaking strength of the cohesive inorganic filler particles is 20 MPa or lower, and the modulus of elasticity thereof is 48 MPa or higher. From this viewpoint, it is more preferable that the cohesive inorganic filler particles be boron nitride cohesive particles having a house-of-cards structure.

The degree of deformation in contact between the cohesive inorganic filler particles in the heat dissipation sheet can be expressed by the indices shown below. That is, in an observation of a cross section of the heat dissipation sheet in the thickness direction, when the sum of areas of virtual circles having the largest diameter of the cohesive inorganic filler particle satisfying the conditions A and B as a diameter d is regarded as $S_v$, the degree of deformation in contact between the cohesive inorganic filler particles satisfying the conditions A and B in the heat dissipation sheet can be expressed with the numerical value of the sum $S_h$ with respect to the sum $S_v$ of cross-sectional areas of the cohesive inorganic filler particles satisfying the conditions A and B.

For example, description will be given using FIG. 3. The longest lines passing through the centers of the cohesive inorganic filler particles 1 as indicated by the ambidirectional arrows are regarded as the particle diameters (diameters) d of the cohesive inorganic filler particles 1, and the sum $S_h$ of the cross-sectional areas of the actually deformed cohesive inorganic filler particles 1 with respect to the sum $S_v$ of the areas of the virtual circles having the diameter d is obtained.

A method of obtaining the sum $S_h$ and the sum $S_v$ is not particularly limited. Examples thereof include a method of utilizing image analysis software and a method of measuring the weight by performing printing on paper.

When the degree of deformation in contact between the cohesive inorganic filler particles in the heat dissipation sheet, that is, the numerical value of the sum $S_h$ with respect to the sum $S_v$ ($S_h/S_v$) decreases, contact between the cohesive inorganic filler particles increases, the heat conduction paths in the thickness direction of the heat dissipation sheet are enlarged, and voids between the filler particles can be reduced, thereby leading to improvement of insulation properties. Therefore, as the numerical value of $S_h/S_v$ decreases, heat dissipation properties and insulation properties of the heat dissipation sheet are further improved, which is preferable.

Thus, in the present embodiment, in the cohesive inorganic filler particles satisfying the conditions A and B, the sum $S_h$ is 90% or less with respect to the sum $S_v$ (that is, $S_h/S_v$ is 90% or less) (condition D). The ratio $S_h/S_v$ is preferably 87% or less, more preferably 85% or less, and further preferably 80% or less. On the other hand, from the viewpoint of ease of maintaining cohesive structures having high heat dissipation properties inside the cohesive inorganic filler particles at the time of press molding, normally, the ratio $S_h/S_v$ is preferably 40% or more, more preferably 50% or more, and further preferably 55% or more.

Due to the above reasons, the ratio $S_h/S_v$ may be within a range of 40% to 90%, may be within a range of 40% to 87%, may be within a range of 40% to 85%, may be within a range of 40% to 80%, may be within a range of 50% to 90%, may be within a range of 50% to 87%, may be within a range of 50% to 85%, may be within a range of 50% to 80%, may be within a range of 55% to 90%, may be within a range of 55% to 87%, may be within a range of 55% to 85%, and may be within a range of 55% to 80%.

The numerical value of the ratio $S_h/S_v$ can be adjusted in accordance with the breaking strength and the modulus of elasticity of the cohesive inorganic filler particles, the content of the cohesive inorganic filler particles in the heat dissipation sheet, the composition of the resin, the pressing pressure at the time of manufacturing a heat dissipation sheet, or the like.

The heat dissipation sheet according to the embodiment of the second aspect of the present invention described above includes particular cohesive inorganic filler particles and a resin, and half or more of the cohesive inorganic filler particles included in the heat dissipation sheet satisfy the conditions A and B, and the cohesive inorganic filler particles satisfying the conditions A and B satisfy the condition D, thereby having excellent heat conduction properties and insulation properties. When the heat dissipation sheet having excellent heat conduction properties is used in a semiconductor device, it is possible to provide favorable heat dissipation properties even to a power device which generates a large amount of heat.

Third Aspect

A heat dissipation member according to an embodiment of a third aspect of the present invention is a heat dissipation member including a heat dissipation sheet which includes cohesive inorganic filler particles and a resin, and a metal substrate to which the heat dissipation sheet adheres and is characterized by a cross section of the heat dissipation sheet in the thickness direction in the vicinity of the contact interface between the metal substrate and a cohesive inorganic filler.

In the heat dissipation member according to the embodiment of the third aspect of the present invention, a proportion of the number of cohesive inorganic filler particles, of the cohesive inorganic filler particles which are included in the heat dissipation sheet and are present at an interface between the heat dissipation sheet and the metal substrate, satisfying the following conditions E and F is 60% or more with respect to a total number of the cohesive inorganic filler particles present at the interface between the heat dissipation sheet and the metal substrate.

Condition E: an aspect ratio expressed by a ratio of a major diameter to a minor diameter (major diameter/minor diameter) is within a range of a number larger than 1 and less than or equal to 2

Condition F: in an observation of a cross section of the heat dissipation sheet in a thickness direction, in triangles formed to have one side which is a straight line constituted by a contact interface between the metal substrate and a cohesive inorganic filler particle and an apex which is a center of a virtual circle having a largest diameter of the cohesive inorganic filler particle as a diameter, an angle $\theta_2$ formed by connecting both ends of the straight line to the apex becomes 30 degrees or larger The metal substrate is similar to the metal substrate used in the method of manufacturing a heat dissipation sheet described in the first aspect. Specifically, the metal substrate corresponds to a metal substrate or a metal electrode used as a heat dissipation board in a semiconductor device. It is preferable to use a conductor which is highly heat-conductive, such as copper or aluminum, as a metal to be used, and the thickness of the metal substrate is preferably within a range of 0.01 to 10 mmt. In addition, a surface of a metal substrate or a metal electrode to be used may be subjected to surface roughening or improvement in resin affinity through machine processing, chemical treatment, or the like.

Examples of the cohesive inorganic filler particles and the resin included in the heat dissipation sheet include the cohesive inorganic filler particles and the resin included in the heat dissipation sheet according to the embodiment of the first aspect.

Since the heat dissipation sheet included in the heat dissipation member according to the present embodiment includes cohesive inorganic filler particles in a matrix resin, voids are likely to be generated after the sheet is made. In order to reduce this, pressing is performed in the thickness direction of the heat dissipation sheet. A specific method of manufacturing a heat dissipation member is similar to the method of manufacturing the heat dissipation sheet according to the embodiment of the first aspect.

The voids in the heat dissipation sheet are reduced due to the pressing. On the other hand, a pressure is also applied to the cohesive inorganic filler particles in the heat dissipation sheet so that the cohesive inorganic filler particles which come into contact with the metal substrate come into surface contact therewith instead of coming into point contact. Further, these parts in surface contact with each other are observed as "parts having a decreased area due to deformation compared to that before being pressed" in an observation of a cross section in the thickness direction. In addition, although it depends on the content of the cohesive inorganic filler particles, the shapes of the cohesive inorganic filler particles in the heat dissipation sheet may be polygonal shapes such as pentagonal shapes or hexagonal shapes.

In this manner, deformation occurs at the contact interface between the metal substrate and the cohesive inorganic filler particles due to breakage or the like, and the area thereof decreases. On the other hand, the cohesive structures themselves come into surface contact without collapsing. Thus, contact between the metal substrate and the cohesive inorganic filler particles increases, the heat conduction paths from the metal substrate to the heat dissipation sheet are enlarged, and voids between the cohesive inorganic filler particles can also be reduced. Accordingly, a heat dissipation sheet having high heat dissipation performance and excellent insulation properties can be produced.

As long as such shapes can be realized in a heat dissipation sheet, the kind of cohesive inorganic filler particles is not specifically limited. However, it is preferable that the breaking strength of the cohesive inorganic filler particles not be excessively high and the filler particles themselves be cohesive inorganic filler particles having a sufficient modulus of elasticity. Specifically, the breaking strength of the cohesive inorganic filler particles is 20 MPa or lower, and the modulus of elasticity thereof is 48 MPa or higher. From this viewpoint, it is more preferable that the cohesive inorganic filler particles be boron nitride cohesive particles having a house-of-cards structure.

In an observation of a cross section of the heat dissipation sheet in the thickness direction, it is preferable that the angle $\theta_2$ formed between two intersections, of a virtual circle having the largest diameter of a cohesive inorganic filler particle (in which the contact interface between the metal substrate and the cohesive inorganic filler particles constitutes a straight line part) as a diameter and this straight line part, and the center of this virtual circle be 30 degrees or larger. That is, in triangles formed to have one side which is a straight line constituted by a contact interface between the metal substrate and a cohesive inorganic filler particle and an apex which is a center of a virtual circle having a largest diameter of the cohesive inorganic filler particle as a diameter, it is preferable that the angle $\theta_2$ formed by connecting both ends of the straight line to the apex be 30 degrees or larger. This will be described based on FIG. 4.

FIG. 4 is a schematic view of an enlarged cross section showing an example of a heat dissipation member 100 including the heat dissipation sheet 10 and a metal substrate 20 to which the heat dissipation sheet 10 is adhered. The cohesive inorganic filler particles 1 in FIG. 4 are cohesive inorganic filler particles in which a contact interface 4 between the metal substrate 20 and the cohesive inorganic filler particle constitutes a straight line part E-F. It is preferable that the angle $\theta_2$ formed between intersections E and F, of a virtual circle having the largest diameter d of the cohesive inorganic filler particles 1 (which comes into contact with the metal substrate 20) as a diameter and the straight line part of the contact interface 4, and the center of a virtual circle G be 30 degrees or larger. This angle $\theta_2$ expresses the state of the original cohesive inorganic filler particles squashed due to contact between the cohesive inorganic filler particles 1 and the metal substrate 20. The angle $\theta_2$ may be 45 degrees or larger and may be 60 degrees or larger. On the other hand, normally, the angle $\theta_2$ is preferably 180 degrees or smaller. It may be 135 degrees or smaller, may be 120 degrees or smaller, and may be 105 degrees or smaller.

Due to the above reasons, the angle $\theta_2$ may be within a range of 30 to 180 degrees, may be within a range of 30 to 135 degrees, may be within a range of 30 to 120 degrees, may be within a range of 30 to 105 degrees, may be within a range of 45 to 180 degrees, may be within a range of 45 to 135 degrees, may be within a range of 45 to 120 degrees, may be within a range of 45 to 105 degrees, may be within a range of 60 to 180 degrees, may be within a range of 60 to 135 degrees, may be within a range of 60 to 120 degrees, and may be within a range of 60 to 105 degrees.

The state of contact between the cohesive inorganic filler particles in the heat dissipation sheet and the metal substrate can be checked by cutting the cured heat dissipation sheet and observing a cross section thereof with an optical microscope or a scanning electron microscope.

The aspect ratio of the cohesive inorganic filler particles of 60% or more of the cohesive inorganic filler particles which are included in the heat dissipation sheet and are present at the interface between the heat dissipation sheet and the metal substrate is within a range of a number larger than 1 and less than or equal to 2 (condition E). In the present embodiment, cohesive inorganic filler particles having an aspect ratio within a range of a number larger than 1 and less than or equal to 2 are regarded as filler particles in which "spherical shapes are maintained". According to a photograph of a cross section of a heat dissipation sheet, cohesive inorganic filler particles in which spherical shapes are maintained indicate that these filler particles maintain spherical shapes and primary particles making the cohesive structures retain isotropy. The aspect ratio of the cohesive inorganic filler particles maintaining spherical shapes is within a range of a number larger than 1 and less than or equal to 2, preferably within a range of a number larger than 1 and less than or equal to 1.75, more preferably within a range of 1 to 1.5, and further preferably within a range of 1 to 1.4.

The degree of surface contact between the cohesive inorganic filler particles in the heat dissipation sheet and the metal substrate can be expressed by the indices shown below. That is, in an observation of a cross section of the heat dissipation sheet in the thickness direction, in triangles formed to have one side which is a straight line constituted by a contact interface between the metal substrate and a cohesive inorganic filler particle and an apex which is a center of a virtual circle having a largest diameter of the cohesive inorganic filler particle as a diameter, an angle formed by connecting both ends of the straight line to the apex is regarded as θ2. The degree of surface contact between the cohesive inorganic filler particles in the heat dissipation sheet and the metal substrate can be expressed with the numerical value of the proportion of the number of cohesive inorganic filler particles in which the angle $\theta_2$ becomes 30 degrees or larger with respect to the total number of the cohesive inorganic filler particles present at the interface between the heat dissipation sheet and the metal substrate.

Here, "a straight line" in "a straight line constituted by a contact interface" need not be a straight line in a mathematically strict sense and denotes a state in which the metal substrate and the cohesive inorganic filler particles that come into contact with each other break and/or are deformed substantially in a straight line shape. Regarding a way of drawing the straight line, a straight line connecting points where the metal substrate and the cohesive inorganic filler particles to be in contact with each other begin to come into contact with each other may be taken into consideration.

When the degree of surface contact between the cohesive inorganic filler particles and the metal substrate, that is, the proportion of the number of cohesive inorganic filler particles, of the cohesive inorganic filler particles present at the interface between the heat dissipation sheet and the metal substrate, in which the angle $\theta_2$ becomes 30 degrees or larger increases, contact between the cohesive inorganic filler particles and the metal substrate increases, the heat conduction paths from the metal substrate to the heat dissipation sheet are enlarged, and voids between the filler particles can be reduced so that insulation properties can be improved.

Therefore, as the proportion of the number of cohesive inorganic filler particles in which the angle $\theta_2$ becomes 30 degrees or larger with respect to the total number of the cohesive inorganic filler particles present at the interface between the heat dissipation sheet and the metal substrate increases, heat dissipation properties and insulation properties of the heat dissipation sheet are further improved, which is preferable.

In the present embodiment, since the proportion of the number of cohesive inorganic filler particles, of the cohesive inorganic filler particles present at the interface between the heat dissipation sheet and the metal substrate, satisfying the conditions E and F is 60% or more with respect to the total number of the cohesive inorganic filler particles present at the interface between the heat dissipation sheet and the metal substrate, heat conduction properties with respect to the metal substrate are improved, and a circuit board using this has a heat dissipation effect due to excellent heat conduction properties unprecedented in the related art and has improved insulation properties due to reduced voids at the interface so that a device can have a high output and a high density with high reliability.

The proportion of the number of cohesive inorganic filler particles satisfying the conditions E and F may be 60% or more. It is preferably 65% or more, more preferably 70% or more, further preferably 75% or more, and particularly preferably 80% or more. In addition, the upper limit value therefor is not particularly limited, and it is preferable to have a higher proportion thereof.

The proportion of the number of cohesive inorganic filler particles satisfying the conditions E and F can be adjusted in accordance with the breaking strength and the modulus of elasticity of the cohesive inorganic filler particles, the content of the cohesive inorganic filler particles in the heat dissipation sheet, the composition of the resin, the pressing pressure at the time of manufacturing a heat dissipation sheet, or the like.

In the present embodiment, it is preferable that half or more of the inorganic filler particles included in the heat dissipation sheet satisfy the conditions A and B, and the inorganic filler particles satisfying the conditions A and B satisfy the condition C or D. That is, it is preferable that the heat dissipation sheet included in the heat dissipation member according to the present embodiment be the heat dissipation sheet according to the embodiment of the first aspect or the second aspect. Accordingly, heat conduction properties and insulation properties are further enhanced.

The heat dissipation member according to the embodiment of the third aspect of the present invention described above includes a heat dissipation sheet which includes particular cohesive inorganic filler particles and a resin, and a metal substrate to which the heat dissipation sheet adheres. Further, cohesive inorganic filler particles of 60% or more of the total number of the cohesive inorganic filler particles which are included in the heat dissipation sheet and are present at the interface between the heat dissipation sheet and the metal substrate satisfy the conditions E and F, thereby having excellent heat conduction properties and insulation properties. When the heat dissipation sheet having excellent heat conduction properties is used in a semiconductor device, it is possible to provide favorable heat dissipation properties even to a power device which generates a large amount of heat.

Other aspects of the present invention are as follows.

(1) A heat dissipation sheet is provided, including cohesive inorganic filler particles and a resin.

A breaking strength of the cohesive inorganic filler particles is 20 MPa or lower, and a modulus of elasticity of the cohesive inorganic filler particles is 48 MPa or higher, Half or more of the cohesive inorganic filler particles included in the heat dissipation sheet satisfy the following conditions A and B, and the cohesive inorganic filler particles satisfying the following conditions A and B satisfy the following condition C.

Condition A: cohesive inorganic filler particles are in surface contact with each other Condition B: an aspect ratio expressed by a ratio of a major diameter to a minor diameter (major diameter/minor diameter) is within a range of a number larger than 1 and less than or equal to 2

Condition C: in an observation of a cross section of the heat dissipation sheet in a thickness direction, in triangles formed to have one side which is a straight line constituted by a contact interface between cohesive inorganic filler particles and an apex which is a center of a virtual circle having a largest diameter of the cohesive inorganic filler particle as a diameter, a sum $S_t$ of areas of triangles in which an angle $\theta_1$ formed by connecting both ends of the straight line to the apex becomes 30 degrees or larger is 20% or more with respect to a sum $S_h$ of cross-sectional areas of the cohesive inorganic filler particles (2) In the heat dissipation sheet according to (1), the sum $S_t$ is 23% or more with respect to the sum $S_h$ under the condition C.

(3) In the heat dissipation sheet according to (2), the sum $S_t$ is 25% or more with respect to the sum $S_h$ under the condition C.

(4) In the heat dissipation sheet according to any one of (1) to (3), the sum $S_t$ is 99% or less with respect to the sum $S_h$ under the condition C.

(5) In the heat dissipation sheet according to (4), the sum $S_t$ is 95% or less with respect to the sum $S_h$ under the condition C.

(6) In the heat dissipation sheet according to (5), the sum $S_t$ is 80% or less with respect to the sum $S_h$ under the condition C.

(7) A heat dissipation sheet is provided, including cohesive inorganic filler particles and a resin.

A breaking strength of the cohesive inorganic filler particles is 20 MPa or lower, and a modulus of elasticity of the cohesive inorganic filler particles is 48 MPa or higher, Half or more of the cohesive inorganic filler particles included in the heat dissipation sheet satisfy the following conditions A and B, and the cohesive inorganic filler particles satisfying the following conditions A and B satisfy the following condition D.

Condition A: cohesive inorganic filler particles are in surface contact with each other Condition B: an aspect ratio expressed by a ratio of a major diameter to a minor diameter (major diameter/minor diameter) is within a range of a number larger than 1 and less than or equal to 2

Condition D: in an observation of a cross section of the heat dissipation sheet in a thickness direction, a sum $S_h$ of cross-sectional areas of the cohesive inorganic filler particles is 90% or less with respect to a sum $S_v$ of areas of virtual circles having a largest diameter of the cohesive inorganic filler particle as a diameter (8) In the heat dissipation sheet according to (7), the sum $S_h$ is 87% or less with respect to the sum $S_v$ under the condition D.

(9) In the heat dissipation sheet according to (8), the sum $S_h$ is 85% or less with respect to the sum $S_v$ under the condition D.

(10) In the heat dissipation sheet according to any one of (7) to (9), the sum $S_h$ is 40% or more with respect to the sum $S_v$ under the condition D.

(11) In the heat dissipation sheet according to (10), the sum $S_h$ is 50% or more with respect to the sum $S_v$ under the condition D.

(12) In the heat dissipation sheet according to (11), the sum $S_h$ is 55% or more with respect to the sum $S_v$ under the condition D.

(13) In the heat dissipation sheet according to any one of (1) to (12), the cohesive inorganic filler particles are boron nitride cohesive particles having a house-of-cards structure.

(14) In the heat dissipation sheet according to any one of (1) to (13), the resin includes an epoxy resin.

(15) In the heat dissipation sheet according to (14), the epoxy resin includes a phenoxy resin.

(16) In the heat dissipation sheet according to (15), the phenoxy resin includes at least one skeleton of the skeletons expressed by the foregoing Formulae (1) to (6) in a main chain.

(17) In the heat dissipation sheet according to (15) or (16), a weight-average molecular weight of the phenoxy resin is within a range of 10,000 to 1,000,000.

(18) In the heat dissipation sheet according to any one of (1) to (17), the resin further includes a low-molecular-weight epoxy resin having a weight-average molecular weight of 600 or smaller.

(19) The heat dissipation sheet according to any one of (1) to (18) further includes a curing accelerator.

(20) In the heat dissipation sheet according to any one of (1) to (19), a content of the cohesive inorganic filler particles is 5 to 90 weight % with respect to the total mass of the heat dissipation sheet.

(21) The heat dissipation sheet according to any one of (1) to (20) further includes different inorganic filler particles other than the cohesive inorganic filler particles.

(22) In the heat dissipation sheet according to (21), the different inorganic filler particles are alumina.

(23) In the heat dissipation sheet according to any one of (1) to (22), a maximum particle diameter on the basis of volume of the cohesive inorganic filler particles is within a range of 2 to 300 μm.

(24) In the heat dissipation sheet according to any one of (1) to (23), an average particle diameter on the basis of volume of the cohesive inorganic filler particles is within a range of 1 to 250 μm.

(25) In the heat dissipation sheet according to any one of (1) to (24), heat conductivity is 10 W/mK or higher.

(26) In the heat dissipation sheet according to any one of (1) to (25), a withstand voltage is 20 kV/mm or higher.

(27) A heat dissipation member is provided, including a heat dissipation sheet which includes cohesive inorganic filler particles and a resin, and a metal substrate to which the heat dissipation sheet adheres.

The breaking strength of the cohesive inorganic filler particles is 20 MPa or lower, and the modulus of elasticity of the cohesive inorganic filler particles is 48 MPa or higher, A proportion of the number of cohesive inorganic filler particles, of the cohesive inorganic filler particles which are included in the heat dissipation sheet and are present at an interface between the heat dissipation sheet and the metal substrate, satisfying the following conditions E and F is 60% or more with respect to a total number of the cohesive inorganic filler particles present at the interface between the heat dissipation sheet and the metal substrate.

Condition E: an aspect ratio expressed by a ratio of a major diameter to a minor diameter (major diameter/minor diameter) is within a range of a number larger than 1 and less than or equal to 2

Condition F: in an observation of a cross section of the heat dissipation sheet in a thickness direction, in triangles formed to have one side which is a straight line constituted by a contact interface between the metal substrate and a cohesive inorganic filler particle and an apex which is a center of a virtual circle having a largest diameter of the cohesive inorganic filler particle as a diameter, an angle $\theta_2$ formed by connecting both ends of the straight line to the apex becomes 30 degrees or larger

(28) In the heat dissipation member according to (27), the proportion of the number of cohesive inorganic filler particles, of the cohesive inorganic filler particles present at the interface between the heat dissipation sheet and the metal substrate, satisfying the conditions E and F is 65% or more with respect to the total number of the cohesive inorganic filler particles present at the interface between the heat dissipation sheet and the metal substrate.

(29) In the heat dissipation member according to (28), the proportion of the number of cohesive inorganic filler particles, of the cohesive inorganic filler particles present at the interface between the heat dissipation sheet and the metal substrate, satisfying the conditions E and F is 70% or more with respect to the total number of the cohesive inorganic filler particles present at the interface between the heat dissipation sheet and the metal substrate.

(30) In the heat dissipation member according to (29), the proportion of the number of cohesive inorganic filler particles, of the cohesive inorganic filler particles present at the interface between the heat dissipation sheet and the metal substrate, satisfying the conditions E and F is 75% or more with respect to the total number of the cohesive inorganic filler particles present at the interface between the heat dissipation sheet and the metal substrate.

(31) In the heat dissipation member according to (30), the proportion of the number of cohesive inorganic filler particles, of the cohesive inorganic filler particles present at the interface between the heat dissipation sheet and the metal substrate, satisfying the conditions E and F is 80% or more with respect to the total number of the cohesive inorganic filler particles present at the interface between the heat dissipation sheet and the metal substrate.

(32) In the heat dissipation member according to any one of (27) to (31), the heat dissipation sheet is the heat dissipation sheet according to any one of (1) to (26).

(33) A semiconductor device is provided, including the heat dissipation sheet according to any one of (1) to (26), or the heat dissipation member according to any one of (27) to (32).

EXAMPLES

Hereinafter, the present invention will be described more specifically using examples, but the present invention is not limited to only the following examples.

Example 1

A bisphenol F-type epoxy resin 1 (weight-average molecular weight: 60,000, and weight per epoxy equivalent: 9,840 g/eq) of 2.5 parts by mass,
an aromatic epoxy resin 2 (weight-average molecular weight: 290, a trifunctional aromatic epoxy resin, and weight per epoxy equivalent: 97 g/eq) of 0.7 parts by mass,
a non-aromatic epoxy resin 3 (weight-average molecular weight: 400, a bifunctional non-aromatic epoxy resin, and weight per epoxy equivalent: 205 g/eq) of 3.1 parts by mass,
a phenol resin 1 (weight per hydroxyl equivalent: 143 g/eq) of 1.6 parts by mass,
an imidazole-based curing accelerator 1 (manufactured by SHIKOKU CHEMICALS CORPORATION, product name "C11Z-CN") of 0.14 parts by mass as a curing accelerator,
spherical-shaped alumina 1 (heat conductivity: 36 W/m·K, manufactured by ADMATECHS Co., Ltd., and volume average particle diameter: 7 μm) of 5.8 parts by mass,
boron nitride cohesive particles 1 having a house-of-cards structure (manufactured by MITSUBISHI CHEMICAL CORPORATION, new Mohs hardness: 2, and volume average particle diameter: 45 μm) of 14.5 parts by mass as boron nitride filler particles (cohesive inorganic filler particles),
methyl ethyl ketone of 8.4 parts by mass as an organic solution, and cyclohexanone of 8.4 parts by mass were mixed in, and a coating slurry was prepared. The complex viscosity of the matrix resin at 100° C. was 18 Pa·s.

Figure 5:
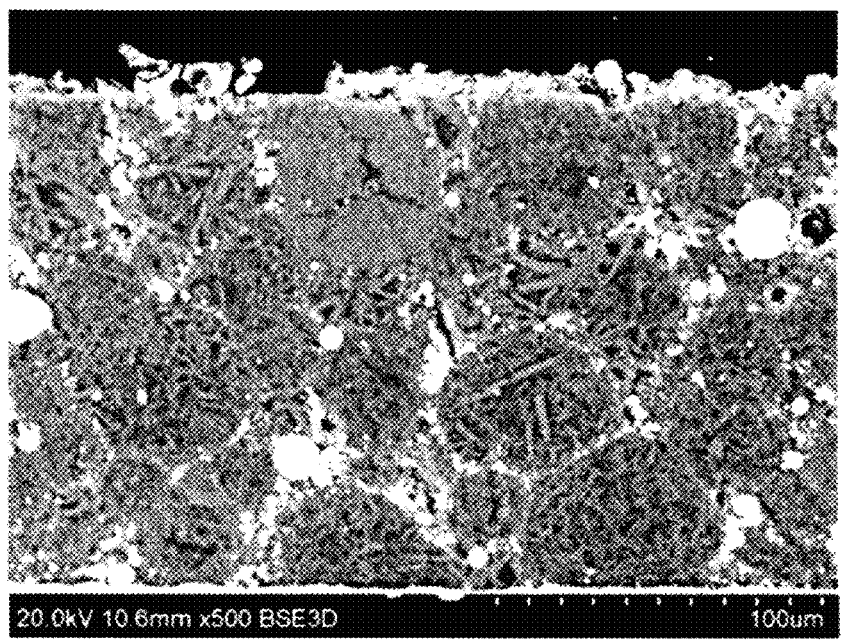
FIG. 5 is an SEM image of a cross section of a heat dissipation sheet manufactured in Example 1 (a photograph substituting for a diagram).

A PET film was coated with the obtained coating slurry by a doctor blade method, and heating and drying were performed. After a copper substrate (40 mm×45 mm) was stacked on the obtained dried coating product (coating film), it was pressed at 30 MPa, and curing was performed. Then, a heat dissipation member in which a heat dissipation sheet (1) adhered to the copper substrate was obtained. The sheet thickness of the heat dissipation sheet (1) was within a range of approximately 130 to 160 μm. FIG. 5 shows an SEM image of a cross section of the heat dissipation sheet (1).

Example 2

A biphenyl epoxy resin 4 (weight-average molecular weight: 30,000, and weight per epoxy equivalent: 9,000 g/eq) of 2.0 parts by mass,
an aromatic epoxy resin 5 (weight-average molecular weight: 380, a bifunctional aromatic epoxy resin, and weight per epoxy equivalent: 189 g/eq) of 2.0 parts by mass,
a non-aromatic epoxy resin 6 (weight-average molecular weight: 400, a tetrafunctional non-aromatic epoxy resin, and weight per epoxy equivalent: 100 g/eq) of 1.9 parts by mass,
the phenol resin 1 of 2.1 parts by mass,
an imidazole-based curing accelerator 2 (manufactured by SHIKOKU CHEMICALS CORPORATION, product name "2E4MZ-A") of 0.12 parts by mass as a curing accelerator,
the spherical-shaped alumina 1 of 5.8 parts by mass,
the boron nitride cohesive particles 1 having a house-of-cards structure of 14.5 parts by mass,
methyl ethyl ketone of 8.4 parts by mass as an organic solution, and cyclohexanone of 8.4 parts by mass were mixed in, and a coating slurry was prepared. The complex viscosity of the matrix resin at 100° C. was 8 Pa·s.

Figure 6:
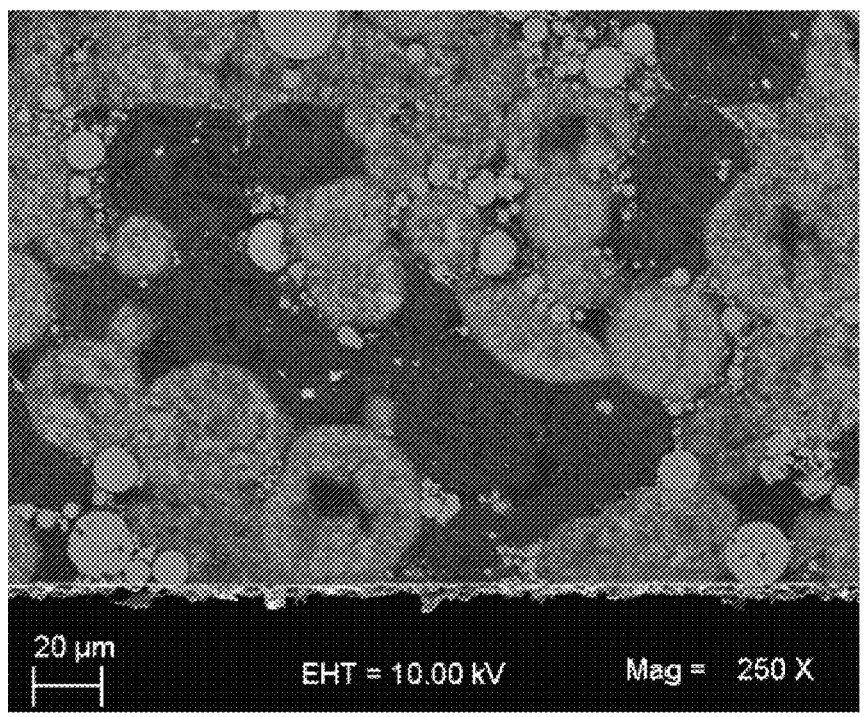
FIG. 6 is an SEM image of a cross section of a heat dissipation sheet manufactured in Example 2 (a photograph substituting for a diagram).

A PET film was coated with the obtained coating slurry by a doctor blade method, and heating and drying were performed. After a copper substrate (40 mm×80 mm) was stacked on the obtained dried coating product (coating film), it was pressed at 30 MPa, and curing was performed. Then, a heat dissipation member in which a heat dissipation sheet (2) adhered to the copper substrate was obtained. The thickness of the heat dissipation sheet (2) was within a range of approximately 130 to 160 μm. FIG. 6 shows an SEM image of a cross section of the obtained heat dissipation sheet (2).

Example 3

Figure 7:
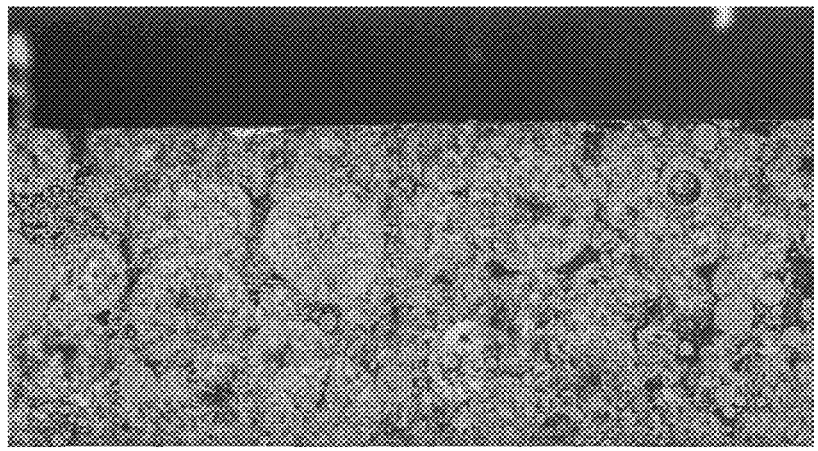
FIG. 7 is an SEM image of a cross section of a heat dissipation sheet manufactured in Example 3 (a photograph substituting for a diagram).

A coating slurry was prepared in a manner similar to that of Example 2.
A PET film was coated with the obtained coating slurry by a doctor blade method, and heating and drying were performed. After the obtained dried coating product (coating film) was peeled off from the PET film and the dried coating product was sandwiched between two copper substrates (40 mm×80 mm), it was pressed at 30 MPa, and curing was performed. Then, a heat dissipation member in which a heat dissipation sheet (3) adhered to the copper substrate was obtained. The thickness of the heat dissipation sheet (3) was within a range of approximately 130 to 160 μm. FIG. 7 shows an SEM image of a cross section of the obtained heat dissipation sheet (3).

Comparative Example 1

A bisphenol A/F-type epoxy resin 7 (weight-average molecular weight: 60,000, and weight per epoxy equivalent: 8,800 g/eq) of 0.17 parts by mass, an aromatic epoxy resin 8 (weight-average molecular weight: 2,950, a multi-functional aromatic epoxy resin, and weight per epoxy equivalent: 210 g/eq) of 0.67 parts by mass, the aromatic epoxy resin 5 of 0.17 parts by mass, a dispersant (manufactured by BYK-CHEMIE JAPAN, product name "BYK-2155") of 0.40 parts by mass, the imidazole-based curing accelerator 1 of 0.06 parts by mass as a curing accelerator, the boron nitride cohesive particles 1 having a house-of-cards structure of 5.5 parts by mass as boron nitride filler particles (cohesive inorganic filler particles), boron nitride cohesive particles 2 having a house-of-cards structure (manufactured by MITSUBISHI CHEMICAL CORPORATION, new Mohs hardness: 2, and volume average particle diameter: 14 μm) of 1.8 parts by mass, methyl ethyl ketone of 0.4 parts by mass as an organic solution, and cyclohexanone of 5.8 parts by mass were mixed in, and a coating slurry was prepared. The complex viscosity of the matrix resin at 100° C. was 50 Pa·s.

Figure 8:
FIG. 8 is an SEM image of a cross section of a heat dissipation sheet manufactured in Comparative Example 1 (a photograph substituting for a diagram).

A copper foil of 0.1 mm was coated with the obtained coating slurry by a doctor blade method, and heating and drying were performed. The obtained dried coating product (coating film) was pressed at 30 MPa, and curing was performed. Then, a heat dissipation member in which a heat dissipation sheet (4) adhered to the copper foil was obtained. The sheet thickness of the heat dissipation sheet (4) was approximately 200 μm. FIG. 8 shows an SEM image of a cross section of the heat dissipation sheet (4).

Comparative Example 2

The bisphenol F-type epoxy resin 1 of 0.50 parts by mass,
the aromatic epoxy resin 2 of 0.14 parts by mass,
the non-aromatic epoxy resin 3 of 0.29 parts by mass,
a non-aromatic epoxy resin 9 (weight-average molecular weight: 400, a trifunctional non-aromatic epoxy resin, and weight per epoxy equivalent: 205 g/eq) of 0.29 parts by mass,
the phenol resin 1 of 0.36 parts by mass,
the imidazole-based curing accelerator 1 of 0.02 parts by mass as a curing accelerator,
the spherical-shaped alumina 1 of 20.9 parts by mass, and
methyl ethyl ketone of 2.4 parts by mass as an organic solution were mixed in, and a coating slurry was prepared. The complex viscosity of the matrix resin at 100° C. was 20 Pa·s.

Figure 9:
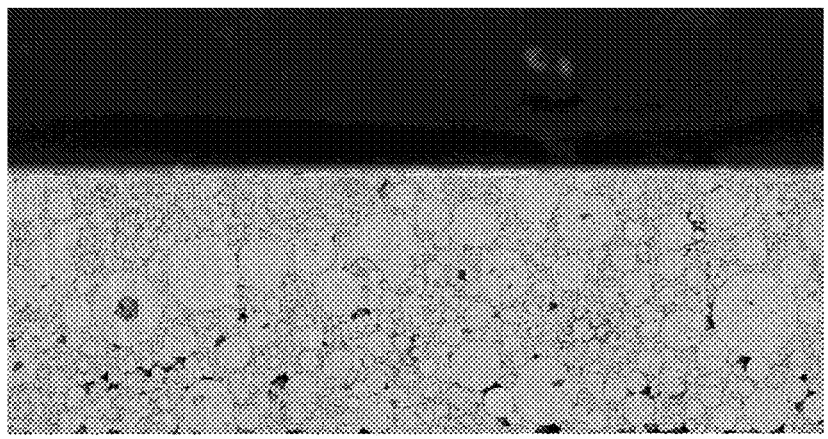
FIG. 9 is an SEM image of a cross section of a heat dissipation sheet manufactured in Comparative Example 2 (a photograph substituting for a diagram).

A PET film was coated with the obtained coating slurry by a doctor blade method, and heating and drying were performed. After the obtained dried coating product (coating film) was peeled off from the PET film and the dried coating product was sandwiched between two copper substrates (40 mm×80 mm), it was pressed at 30 MPa, and curing was performed. Then, a heat dissipation member in which a heat dissipation sheet (5) adhered to the copper substrate was obtained. The sheet thickness of the heat dissipation sheet (5) was within a range of approximately 130 to 160 μm. FIG. 9 shows an SEM image of a cross section of the obtained heat dissipation sheet (5).

Hereinafter, measurement conditions of the heat dissipation sheets and the heat dissipation members obtained in Examples 1 to 3 and Comparative Examples 1 and 2 will be disclosed.

(Measurement of Breaking Strength and Modulus of Elasticity of Cohesive Inorganic Filler)

Measurement of the breaking strength and the modulus of elasticity of the cohesive inorganic filler particles was performed by the following technique.

The breaking strength of the cohesive inorganic filler particle was measured using a micro-compression testing machine (manufactured by SHIMADZU Corporation, product name "MCT-510").

A very small amount of a sample was sprayed on a pressure plate installed in a lower portion of a micro-compression testing machine, and a compression test was performed for each particle. The breaking strength was obtained using the following expression from the breaking test force and the particle diameter of the particle at the time when the particle has broken. Five particles were measured, and the average value thereof was taken as the breaking strength of the cohesive inorganic filler.

$$Cs = 2.48 P/\pi d^2$$

("Cs" indicates the breaking strength (MPa), "P" indicates the breaking test force (N), and "d" indicates the particle diameter (mm))

Normally, regarding calculation of the breaking strength, it is calculated using the test force at a breaking point. However, when the breaking point is not clear (for example, the sample was deformed but there was no sudden breakage), a test force at the time when deformation of 10% (10% strength) was applied was used as a reference strength in comparison. The 10% strength was calculated by the following expression.

$$Cx = 2.48 P/\pi d^2$$

("Cx" indicates the 10% strength (MPa), "P" indicates the test force (N) at the time of 10% displacement of the particle diameter, and "d" indicates the particle diameter (mm))

The modulus of elasticity of the cohesive inorganic filler particle was calculated by the following expression from the test force at the time when breakage has occurred and compression displacement at this time using the device used for measuring the breaking strength.

$$E = 3 \times (1-v^2) \times P/4 \times (d/2)^{1/2} \times Y^{3/2}$$

("E" indicates the modulus of elasticity (MPa), "v" indicates the Poisson's ratio, "P" indicates the breaking test force (N), "d" indicates the particle diameter (mm), and "Y" indicates compression displacement (mm); and the Poisson's ratio is presumed to be constant (0.13))

(Measurement of Complex Viscosity of Resin)

Measurement of the complex viscosity of the resin was performed under conditions and using devices as follows.

The complex viscosity was measured using a viscoelasticity-measuring device MCR302 (manufactured by ANTON-PAAR).

Specifically, a resin of approximately 0.1 g was used to measure the complex viscosity using a parallel plate having a diameter of 10 mm under conditions of a measurement distortion of 0.3%, a measurement frequency of 1 Hz, a measurement gap (interval between jigs) of 0.5 mm, and a measurement temperature of 100° C.

(Regarding Conditions a to F)

Regarding the heat dissipation sheet, it was checked whether or not the following condition A-1 was satisfied. When it was satisfied, "I" was marked, and when it was not satisfied, "II" was marked. The case in which the following condition A-1 is not satisfied denotes that half or more of the cohesive inorganic filler particles included in the heat dissipation sheet do not satisfy the condition A.

A-1: in half or more of the cohesive inorganic filler particles included in the heat dissipation sheet, the cohesive inorganic filler particles are in surface contact with each other Regarding the heat dissipation sheet, it was checked whether or not each of the following conditions B-1, B-2, B-3, and B-4 was satisfied. When they were satisfied, "I" was marked, and when they were not satisfied, "II" was marked.

The case in which the following condition B-1 is not satisfied denotes that half or more of the cohesive inorganic filler particles included in the heat dissipation sheet do not satisfy the condition B.

B-1: in half or more of the cohesive inorganic filler particles included in the heat dissipation sheet, the aspect ratio is within a range of a number larger than 1 and less than or equal to 2

B-2: in half or more of the cohesive inorganic filler particles included in the heat dissipation sheet, the aspect ratio is within a range of a number larger than 1 and less than or equal to 1.75

B-3: in half or more of the cohesive inorganic filler particles included in the heat dissipation sheet, the aspect ratio is within a range of a number larger than 1 and less than or equal to 1.5

B-4: in half or more of the cohesive inorganic filler particles included in the heat dissipation sheet, the aspect ratio is within a range of a number larger than 1 and less than or equal to 1.4

Regarding the heat dissipation sheet, in an observation of a cross section in the thickness direction, it was checked whether or not the cohesive inorganic filler particles included in the heat dissipation sheet satisfying the foregoing conditions A-1 and B-1 satisfied each of the following conditions C-1, C-2, C-3, C-4, C-5, and C-6. When they were satisfied, "I" was marked, and when they were not satisfied, "II" was marked. The case in which the following condition C-1 is not satisfied denotes that the cohesive inorganic filler particles included in the heat dissipation sheet satisfying the foregoing conditions A-1 and B-1 do not satisfy the condition C.

C-1: in the cohesive inorganic filler particles included in the heat dissipation sheet satisfying the foregoing conditions A-1 and B-1, the ratio $S_v/S_h$ is 20% or more C-2: in the cohesive inorganic filler particles included in the heat dissipation sheet satisfying the foregoing conditions A-1 and B-1, the ratio $S_v/S_h$ is within a range of 20% to 99%

C-3: in the cohesive inorganic filler particles included in the heat dissipation sheet satisfying the foregoing conditions A-1 and B-1, the ratio $S_v/S_h$ is within a range of 20% to 95%

C-4: in the cohesive inorganic filler particles included in the heat dissipation sheet satisfying the foregoing conditions A-1 and B-1, the ratio $S_v/S_h$ is within a range of 23% to 95%

C-5: in the cohesive inorganic filler particles included in the heat dissipation sheet satisfying the foregoing conditions A-1 and B-1, the ratio $S_v/S_h$ is within a range of 23% to 80%

C-6: in the cohesive inorganic filler particles included in the heat dissipation sheet satisfying the foregoing conditions A-1 and B-1, the ratio $S_v/S_h$ is within a range of 25% to 80%

Regarding the heat dissipation sheet, in an observation of a cross section in the thickness direction, it was checked whether or not the cohesive inorganic filler particles included in the heat dissipation sheet satisfying the foregoing conditions A-1 and B-1 satisfied each of the following conditions D-1, D-2, D-3, D-4, D-5, and D-6. When it was satisfied, "I" was marked, and when it was not satisfied, "II" was marked. The case in which the following condition D-1 is not satisfied denotes that the cohesive inorganic filler particles included in the heat dissipation sheet satisfying the foregoing conditions A-1 and B-1 do not satisfy the condition D.

D-1: in the cohesive inorganic filler particles included in the heat dissipation sheet satisfying the foregoing conditions A-1 and B-1, the ratio $S_h/S_v$ is 90% or less D-2: in the cohesive inorganic filler particles included in the heat dissipation sheet satisfying the foregoing conditions A-1 and B-1, the ratio $S_h/S_v$ is within a range of 40% to 90%

D-3: in the cohesive inorganic filler particles included in the heat dissipation sheet satisfying the foregoing conditions A-1 and B-1, the ratio $S_h/S_v$ is within a range of 50% to 90%

D-4: in the cohesive inorganic filler particles included in the heat dissipation sheet satisfying the foregoing conditions A-1 and B-1, the ratio $S_h/S_v$ is within a range of 50% to 87%

D-5: in the cohesive inorganic filler particles included in the heat dissipation sheet satisfying the foregoing conditions A-1 and B-1, the ratio $S_h/S_v$ is within a range of 55% to 87%

D-6: in the cohesive inorganic filler particles included in the heat dissipation sheet satisfying the foregoing conditions A-1 and B-1, the ratio $S_h/S_v$ is within a range of 55% to 85%

Regarding the heat dissipation member, it was checked whether or not each of the following conditions E-1, E-2, E-3, E-4, and E-5 was satisfied. When it was satisfied, "I" was marked, and when it was not satisfied, "II" was marked. The case in which the following condition E-1 is not satisfied denotes that more than 40% of the cohesive inorganic filler particles which are included in the heat dissipation sheet and are present at the interface between the heat dissipation sheet and the metal substrate do not satisfy the condition E.

E-1: the proportion of the number of cohesive inorganic filler particles, of the cohesive inorganic filler particles present at the interface between the heat dissipation sheet and the metal substrate, having an aspect ratio within a range of a number larger than 1 and less than or equal to 2 is 60% or more with respect to the total number of the cohesive inorganic filler particles present at the interface between the heat dissipation sheet and the metal substrate E-2: the proportion of the number of cohesive inorganic filler particles, of the cohesive inorganic filler particles present at the interface between the heat dissipation sheet and the metal substrate, having an aspect ratio within a range of a number larger than 1 and less than or equal to 2 is 65% or more with respect to the total number of the cohesive inorganic filler particles present at the interface between the heat dissipation sheet and the metal substrate E-3: the proportion of the number of cohesive inorganic filler particles, of the cohesive inorganic filler particles present at the interface between the heat dissipation sheet and the metal substrate, having an aspect ratio within a range of a number larger than 1 and less than or equal to 2 is 70% or more with respect to the total number of the cohesive inorganic filler particles present at the interface between the heat dissipation sheet and the metal substrate E-4: the proportion of the number of cohesive inorganic filler particles, of the cohesive inorganic filler particles present at the interface between the heat dissipation sheet and the metal substrate, having an aspect ratio within a range of a number larger than 1 and less than or equal to 2 is 75% or more with respect to the total number of the cohesive inorganic filler particles present at the interface between the heat dissipation sheet and the metal substrate E-5: the proportion of the number of cohesive inorganic filler particles, of the cohesive inorganic filler particles present at the interface between the heat dissipation sheet and the metal substrate, having an aspect ratio within a range of a number larger than 1 and less than or equal to 2 is 80% or more with respect to the total number of the cohesive inorganic filler particles present at the interface between the heat dissipation sheet and the metal substrate Regarding the heat dissipation member, it was checked whether or not each of the following conditions F-1, F-2, F-3, F-4, and F-5 was satisfied. When it was satisfied, "I" was marked, and when it was not satisfied, "II" was marked. The case in which the following condition F-1 is not satisfied denotes that more than 40% of the cohesive inorganic filler particles which are included in the heat dissipation sheet and are present at the interface between the heat dissipation sheet and the metal substrate do not satisfy the condition F.

F-1: the proportion of the number of cohesive inorganic filler particles, of the cohesive inorganic filler particles present at the interface between the heat dissipation sheet and the metal substrate, which satisfy the foregoing condition E-1 and in which the angle θ2 becomes 30 degrees or larger is 60% or more with respect to the total number of the cohesive inorganic filler particles present at the interface between the heat dissipation sheet and the metal substrate F-2: the proportion of the number of cohesive inorganic filler particles, of the cohesive inorganic filler particles present at the interface between the heat dissipation sheet and the metal substrate, which satisfy the foregoing condition E-1 and in which the angle θ2 becomes 30 degrees or larger is 65% or more with respect to the total number of the cohesive inorganic filler particles present at the interface between the heat dissipation sheet and the metal substrate F-3: the proportion of the number of cohesive inorganic filler particles, of the cohesive inorganic filler particles present at the interface between the heat dissipation sheet and the metal substrate, which satisfy the foregoing condition E-1 and in which the angle θ2 becomes 30 degrees or larger is 70% or more with respect to the total number of the cohesive inorganic filler particles present at the interface between the heat dissipation sheet and the metal substrate F-4: the proportion of the number of cohesive inorganic filler particles, of the cohesive inorganic filler particles present at the interface between the heat dissipation sheet and the metal substrate, which satisfy the foregoing condition E-1 and in which the angle θ2 becomes 30 degrees or larger is 75% or more with respect to the total number of the cohesive inorganic filler particles present at the interface between the heat dissipation sheet and the metal substrate F-5: the proportion of the number of cohesive inorganic filler particles, of the cohesive inorganic filler particles present at the interface between the heat dissipation sheet and the metal substrate, which satisfy the foregoing condition E-1 and in which the angle θ2 becomes 30 degrees or larger is 80% or more with respect to the total number of the cohesive inorganic filler particles present at the interface between the heat dissipation sheet and the metal substrate (Measurement of Heat Conductivity in Thickness Direction of Heat Dissipation Sheet)

The heat resistance values of the heat dissipation sheets which were produced with the same composition and under the same conditions and had different thicknesses were measured using a heat resistance-measuring device (manufactured by MENTOR GRAPHICS CORPORATION, product name "T3ster"), and the heat conductivities were obtained from the slope of the graph in which the heat resistance values were plotted with respect to the thicknesses.

(Measurement of Withstand Voltage of Heat Dissipation Sheet)

In insulating oil, the voltage was increased by 500 V every minute, and the voltage at which the sample broke was obtained.

Regarding the obtained heat dissipation sheets (1) to (5), the breaking strength and the modulus of elasticity of the cohesive inorganic filler particles in the heat dissipation sheet were measured, and the complex viscosity of the resin was measured. Moreover, it was checked whether or not the heat dissipation sheet or the heat dissipation member satisfied the conditions A to F. It was not checked whether or not the heat dissipation sheets (1) and (2) satisfied the conditions E and F. Since the heat dissipation sheet (5) includes no cohesive inorganic filler particles, it was not checked whether or not the conditions A to F were satisfied. In addition, regarding the heat dissipation sheets (1) to (5), the heat conductivity in the thickness direction of the heat dissipation sheet was measured and the withstand voltage of the heat dissipation sheet was measured. Table 1 shows the results thereof.

TABLE 1

|  |  | Example 1 | Example 2 | Example 3 | Comparative Example 1 | Comparative Example 2 |
|---|---|---|---|---|---|---|
| Breaking strength of cohesive inorganic filler particles [MPa] | | 6 | 6 | 6 | 6 | None |
| Modulus of elasticity of cohesive inorganic filler particles [MPa] | | 65 | 65 | 65 | 65 | None |
| Complex viscosity of resin at 100° C. [Pa · s] | | 18 | 8 | 8 | 50 | 20 |
| Condition A | A-1 | I | I | I | I | — |
| Condition B | B-1 (larger than 1 and less than or equal to 2) | I | I | I | I | — |
|  | B-2 (larger than 1 and less than or equal to 1.75) | I | I | I | I | — |
|  | B-3 (larger than 1 and less than or equal to 1.5) | I | I | I | I | — |
|  | B-4 (larger than 1 and less than or equal to 1.4) | I | I | I | I | — |
| Condition C | C-1 (20% or more) | I | I | I | II | — |

TABLE 1-continued

|  |  | Example 1 | Example 2 | Example 3 | Comparative Example 1 | Comparative Example 2 |
|---|---|---|---|---|---|---|
|  | C-2 (20% to 99%) | I | I | I | — | — |
|  | C-3 (20% to 95%) | I | I | I | — | — |
|  | C-4 (23% to 95%) | I | I | I | — | — |
|  | C-5 (23% to 80%) | I | I | I | — | — |
|  | C-6 (25% to 80%) | I | I | I | — | — |
| Condition D | D-1 (90% or less) | I | I | I | II | — |
|  | D-2 (40% to 90%) | I | I | I | — | — |
|  | D-3 (50% to 90%) | I | I | I | — | — |
|  | D-4 (50% to 87%) | I | I | I | — | — |
|  | D-5 (55% to 87%) | I | I | I | — | — |
|  | D-6 (55% to 85%) | I | I | I | — | — |
| Condition E | E-1 (60% or more) | — | — | I | I | — |
|  | E-2 (65% or more) | — | — | I | I | — |
|  | E-3 (70% or more) | — | — | I | I | — |
|  | E-4 (75% or more) | — | — | I | I | — |
|  | E-5 (80% or more) | — | — | I | I | — |
| Condition F | F-1 (60% or more) | — | — | I | II | — |
|  | F-2 (65% or more) | — | — | I | — | — |
|  | F-3 (70% or more) | — | — | I | — | — |
|  | F-4 (75% or more) | — | — | I | — | — |
|  | F-5 (80% or more) | — | — | I | — | — |
| Evaluation | Heat conductivity (W/mK) | 15 | 15 | 15 | 17 | 6 |
|  | Withstand voltage (kV/mm) | 50 | 50 | 50 | 25 | 40 |

REFERENCE SIGNS LIST

1 Cohesive inorganic filler particle
2 Matrix resin
3 Contact interface
4 Contact interface
10 Heat dissipation sheet
20 Metal substrate
100 Heat dissipation member
C Center of virtual circle
G Center of virtual circle
d Diameter

The invention claimed is:

1. A heat dissipation sheet, comprising:
cohesive inorganic filler particles; and
a resin,
wherein a breaking strength of the cohesive inorganic filler particles is 20 MPa or lower, and a modulus of elasticity of the cohesive inorganic filler particles is 48 MPa or higher, and
wherein half or more of the cohesive inorganic filler particles included in the heat dissipation sheet satisfy the following conditions A and B, and the cohesive inorganic filler particles satisfying the following conditions A and B satisfy the following condition C
Condition A: cohesive inorganic filler particles are in surface contact with each other
Condition B: an aspect ratio expressed by a ratio of a major diameter to a minor diameter (major diameter/minor diameter) is within a range of a number larger than 1 and less than or equal to 2
Condition C: in an observation of a cross section of the heat dissipation sheet in a thickness direction, in triangles formed to have one side which is a straight line constituted by a contact interface between cohesive inorganic filler particles and an apex which is a center of a virtual circle having a largest diameter of the cohesive inorganic filler particle as a diameter, a sum $S_t$ of areas of triangles in which an angle $\theta_1$ formed by connecting both ends of the straight line to the apex becomes 30 degrees or larger is 20% or more with respect to a sum $S_h$ of cross-sectional areas of the cohesive inorganic filler particles.

2. A heat dissipation sheet, comprising:
cohesive inorganic filler particles;
and a resin,
wherein a breaking strength of the cohesive inorganic filler particles is 20 MPa or lower, and a modulus of elasticity of the cohesive inorganic filler particles is 48 MPa or higher, and
wherein half or more of the cohesive inorganic filler particles included in the heat dissipation sheet satisfy the following conditions A and B, and the cohesive inorganic filler particles satisfying the following conditions A and B satisfy the following condition D
Condition A: cohesive inorganic filler particles are in surface contact with each other
Condition B: an aspect ratio expressed by a ratio of a major diameter to a minor diameter (major diameter/minor diameter) is within a range of a number larger than 1 and less than or equal to 2
Condition D: in an observation of a cross section of the heat dissipation sheet in a thickness direction, a sum $S_h$ of cross-sectional areas of the cohesive inorganic filler particles is 90% or less with respect to a sum $S_v$ of areas of virtual circles having a largest diameter of the cohesive inorganic filler particle as a diameter.

3. The heat dissipation sheet according to claim 1 or 2, wherein the cohesive inorganic filler particles are boron nitride cohesive particles having a house-of-cards structure.

4. A heat dissipation member, comprising:
a heat dissipation sheet which includes cohesive inorganic filler particles and a resin; and
a metal substrate to which the heat dissipation sheet adheres,
wherein a breaking strength of the cohesive inorganic filler particles is 20 MPa or lower, and a modulus of elasticity of the cohesive inorganic filler particles is 48 MPa or higher, and
wherein a proportion of the number of cohesive inorganic filler particles, of the cohesive inorganic filler particles which are included in the heat dissipation sheet and are present at an interface between the heat dissipation sheet and the metal substrate, satisfying the following conditions E and F is 60% or more with respect to a total number of the cohesive inorganic filler particles present at the interface between the heat dissipation sheet and the metal substrate Condition E: an aspect ratio expressed by a ratio of a major diameter to a minor diameter (major diameter/minor diameter) is within a range of a number larger than 1 and less than or equal to 2

Condition F: in an observation of a cross section of the heat dissipation sheet in a thickness direction, in triangles formed to have one side which is a straight line constituted by a contact interface between the metal substrate and a cohesive inorganic filler particle and an apex which is a center of a virtual circle having a largest diameter of the cohesive inorganic filler particle as a diameter, an angle $\theta_2$ formed by connecting both ends of the straight line to the apex becomes 30 degrees or larger.

5. The heat dissipation member according to claim 4, wherein the cohesive inorganic filler particles are boron nitride cohesive particles having a house-of-cards structure.

6. A semiconductor device, comprising:
the heat dissipation sheet according to any one of claims 1 to 3; or
the heat dissipation member according to claim 4 or 5.

* * * * *